United States Patent
Curtis et al.

(10) Patent No.: US 9,543,948 B2
(45) Date of Patent: Jan. 10, 2017

(54) PHYSICAL FORCE CAPACITIVE TOUCH SENSORS

(71) Applicant: Microchip Technology Incorporated, Chandler, AZ (US)

(72) Inventors: Keith Curtis, Gilbert, AZ (US); Fanie Duvenhage, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 331 days.

(21) Appl. No.: 13/743,678

(22) Filed: Jan. 17, 2013

(65) Prior Publication Data

US 2013/0126325 A1    May 23, 2013

Related U.S. Application Data

(63) Continuation-in-part of application No. 13/468,504, filed on May 10, 2012, now Pat. No. 8,858,003, which
(Continued)

(51) Int. Cl.
*G01R 27/26* (2006.01)
*H03K 17/96* (2006.01)
(Continued)

(52) U.S. Cl.
CPC .......... *H03K 17/9622* (2013.01); *H01H 25/04* (2013.01); *H03K 17/962* (2013.01);
(Continued)

(58) Field of Classification Search
CPC  H03K 17/9622; H03K 17/977; H03K 17/975; H01H 25/04
(Continued)

(56) References Cited

U.S. PATENT DOCUMENTS 4,265,252 A * 5/1981 Chubbuck et al. ........... 600/561
4,417,294 A   11/1983 Herron, Jr. ................... 361/288
(Continued)

FOREIGN PATENT DOCUMENTS

EP    2048781 A1    4/2009    ............. H03K 17/96
WO    2006/064234 A1    6/2006    ............. H03K 17/97
(Continued)

OTHER PUBLICATIONS

Curtis, Keith, "Inductive Touch Sensor Design," Microchip Technology Inc., Brochure AN1239, 14 pages, © 2008.
(Continued)

*Primary Examiner* — Daniel Miller
(74) *Attorney, Agent, or Firm* — Slayden Grubert Beard PLLC

(57) ABSTRACT

A physical force capacitive touch sensor comprises a capacitive sensor element on a substrate, a physically deformable electrically insulating spacer over the capacitive sensor element and a conductive deformable plane over the physically deformable electrically insulating spacer. A protective deformable fascia may be placed over the conductive deformable plane to provide an environmental seal for physical and weather protection, but is not essential to operation of the capacitive touch sensor. Back lighting is accomplished through a light transmissive layer(s) in the capacitive touch sensor. When the conductive deformable plane is displaced toward the capacitive touch sensor element, the capacitance value of the capacitive touch sensor element changes and that change may be detected and used as an actuation signal.

32 Claims, 16 Drawing Sheets

Related U.S. Application Data is a continuation of application No. 12/787,474, filed on May 26, 2010, now Pat. No. 8,408,723, application No. 13/743,678, which is a continuation-in-part of application No. 12/556,191, filed on Sep. 9, 2009, now abandoned.

(60) Provisional application No. 61/238,718, filed on Sep. 1, 2009.

(51) Int. Cl.
*H01H 25/04* (2006.01)
*H03K 17/975* (2006.01)

(52) U.S. Cl.
CPC . *H03K 17/975* (2013.01); *H03K 2217/96066* (2013.01); *H03K 2217/960755* (2013.01); *H03K 2217/960785* (2013.01)

(58) Field of Classification Search
USPC .............................................. 73/724, 304 C
See application file for complete search history.

(56) References Cited

U.S. PATENT DOCUMENTS

| | | | |
|---|---|---|---|
| 5,546,806 A | 8/1996 | Kain | 73/514.31 |
| 6,595,653 B2 | 7/2003 | Saito et al. | 362/84 |
| 6,997,572 B2 | 2/2006 | Ono et al. | 362/23.06 |
| 7,296,485 B2 | 11/2007 | Kain | 73/862 |
| 7,667,947 B2 | 2/2010 | Schilling et al. | 361/290 |
| 2002/0144886 A1 | 10/2002 | Engelmann et al. | 200/600 |
| 2003/0042688 A1* | 3/2003 | Davie | F16J 15/061 |
| | | | 277/590 |
| 2003/0234769 A1 | 12/2003 | Cross et al. | 345/173 |
| 2005/0030048 A1* | 2/2005 | Bolender et al. | 324/661 |
| 2006/0267598 A1* | 11/2006 | Morimoto | 324/661 |
| 2008/0018611 A1* | 1/2008 | Serban et al. | 345/173 |
| 2008/0309589 A1 | 12/2008 | Morales | 345/36 |
| 2009/0067151 A1 | 3/2009 | Sahlin et al. | 362/23.03 |
| 2009/0243817 A1 | 10/2009 | Son | 340/407.2 |
| 2010/0081374 A1 | 4/2010 | Moosavi | 455/41.1 |

FOREIGN PATENT DOCUMENTS

| | | | | |
|---|---|---|---|---|
| WO | | 2008/009687 A2 | 1/2008 | G06F 3/041 |
| WO | | 2008/012491 A1 | 1/2008 | G06F 3/033 |
| WO | WO 2008/012491 | * | 1/2008 | G06F 3/046 |

OTHER PUBLICATIONS

International Search Report and Written Opinion, Application No. PCT/US2009/062054, 8 pages, Jan. 15, 2010.

International Search Report and Written Opinion, Application No. PCT/US2010/044845, 11 pages, Oct. 26, 2010.

\* cited by examiner

FIGURE 1 (Prior Technology)

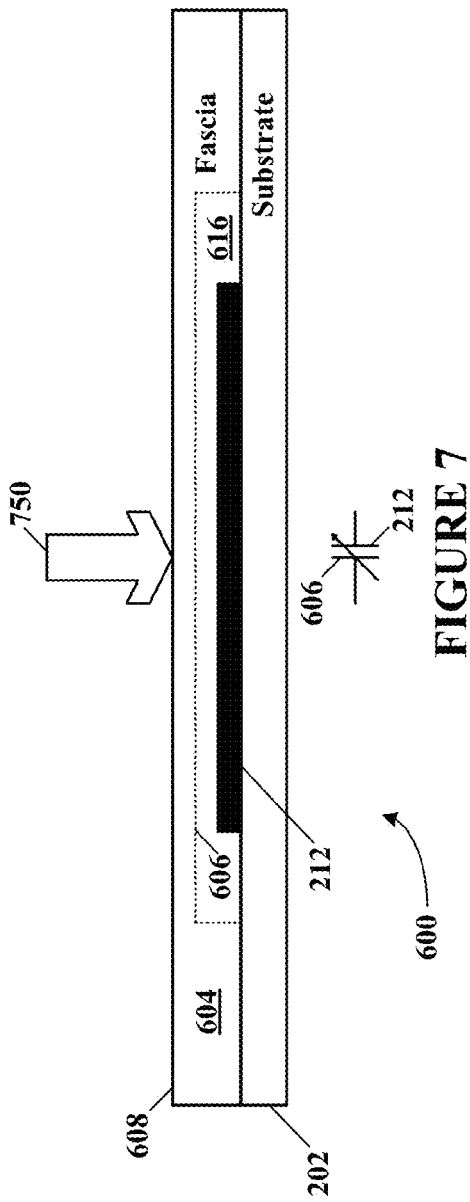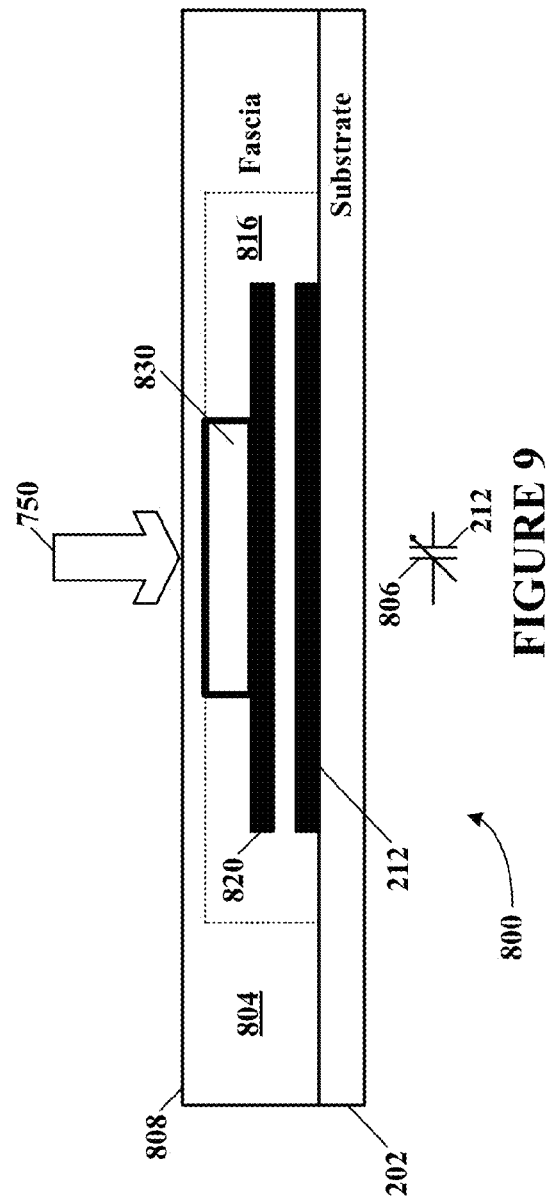

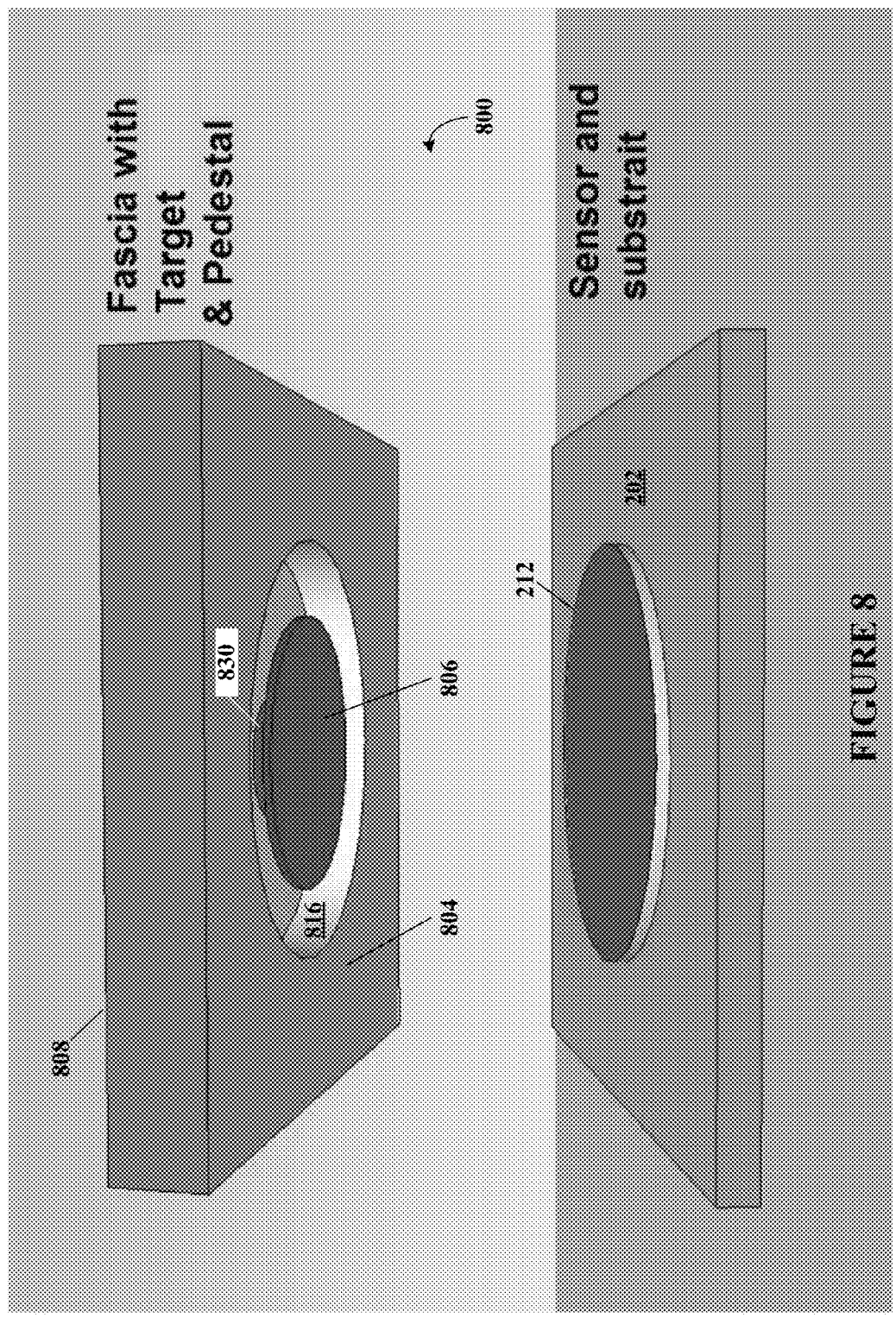

PHYSICAL FORCE CAPACITIVE TOUCH SENSORS

RELATED PATENT APPLICATIONS

This application is a continuation-in-part of U.S. patent application Ser. No. 13/468,504; filed May 10, 2012; which is a continuation of U.S. patent application Ser. No. 12/787,474; filed May 26, 2010; which claims priority to U.S. Provisional Patent Application No. 61/238,718; filed Sep. 1, 2009.

This application is a continuation-in-part U.S. patent application Ser. No. 12/556,191; filed Sep. 9, 2009; which claims priority to U.S. Provisional Patent Application No. 61/108,648; filed Oct. 27, 2008. The contents wherein all are hereby incorporated by reference herein for all purposes.

TECHNICAL FIELD

The present disclosure relates to electronic capacitive touch sensors, e.g., keys, buttons, sliders, rotation, etc.; and more particularly, to a more secure capacitive touch sensor that requires physical force on the touch sensor during activation and further shields the sensor from extraneous unwanted activation by inadvertent proximity of a user.

BACKGROUND

Capacitive touch sensors are used as a user interface to electronic equipment, e.g., calculators, telephones, cash registers, gasoline pumps, etc. The capacitive touch sensors are activated (controls a signal indicating activation) by a change in capacitance of the capacitive touch sensor when an object, e.g., user finger tip, causes the capacitance thereof to change. Referring to FIG. 1, depicted is a prior technology capacitive touch sensor generally represented by the numeral 100. The prior technology capacitive touch sensor 100 comprises a substrate 102, a sensor element 112 and a protective covering 108, e.g., glass. When a user finger tip 110 comes in close proximity to the sensor element 112, the capacitance value of the sensor element 112 changes. This capacitance change is electronically processed (not shown) so as to generate a signal indicating activation of the capacitive touch sensor 100 by the user (only finger tip 110 thereof shown). The protective covering 108 may be used to protect the sensor element 112 and for marking of the sensor 100.

Problems exist with proper operation of the sensor 100 that may be caused by water, oil, mud, and/or food products, e.g., ketchup and mustard, either false triggering activation or inhibiting a desired activation thereof. Also problems exist when metallic objects (not shown) come in near proximity of the sensor element 112 and cause an undesired activation thereof. When there are a plurality of sensors 100 arranged in a matrix, e.g., numeric and/or pictorial arrangement, activation of an intended one of the sensors 100 may cause a neighbor sensor(s) 100 to undesirably actuate because of the close proximity of the user finger tip 110, or other portion of the user hand (not shown). This multiple activation of more then one sensor 100 may be caused when touching the intended sensor 100 and a portion of the user's hand also is sufficiently close to adjacent neighbor sensors 100 for activation thereof.

Each capacitive touch sensor key or button comprises a capacitive sensor on a substrate, a thin dielectric spacer layer over the capacitive touch sensor, and a deformable metal target layer (e.g., key or button) over the thin dielectric spacer layer. When the deformable metal target layer is depressed, the capacitance value of the capacitive sensor changes (increases). This change in capacitance value is detected and is used to indicate that the key or button has been pressed. A problem exists however in that the deformable metal target layer is light opaque and therefore precludes backlighting thereof. Existing published solutions for capacitive touch sensor designs are mechanically very thin. They rely on simple flat spacer layers less than about 50 micrometers thick and continuous conductive metal sheets for targets that do not allow light to pass therethrough.

SUMMARY

The aforementioned problems are solved, and other and further benefits achieved by the capacitive touch sensors disclosed herein.

According to an embodiment, a physical force capacitive touch sensor may comprise: a substrate; a capacitive sensor element on a face of the substrate; a substantially non-deformable spacer on the substrate that surrounds the capacitive sensor element; and an electrically conductive plane proximate to the capacitive sensor element; wherein when a mechanical force may be applied to the electrically conductive plane it may be biased toward the capacitive sensor element, whereby the capacitive sensor element changes capacitance value.

According to a further embodiment, the electrically conductive plane may be flexibly deformable. According to a further embodiment, a flexible cover may be provided over the electrically conductive plane, wherein when the mechanical force may be applied to the flexible cover the electrically conductive plane may be biased toward the capacitive sensor element. According to a further embodiment, a pedestal may be provided between the flexible cover and the electrically conductive plane. According to a further embodiment, a deformable space around the capacitive sensor element may be created by the flexible cover and the substantially non-deformable spacer.

According to a further embodiment, the flexible cover may be light transmissive. According to a further embodiment, the electrically conductive plane may be light transmissive. According to a further embodiment, the capacitive sensor element may be light transmissive. According to a further embodiment, the substrate may be light transmissive. According to a further embodiment, the substantially non-deformable spacer may be light inhibitive.

According to a further embodiment, a light source may be provided for illuminating a face of the flexible cover. According to a further embodiment, the light source may be located between the electrically conductive plane and the flexible cover. According to a further embodiment, the light source may be located between the electrically conductive plane and the capacitive sensor element. According to a further embodiment, the light source may be located between the capacitive sensor element and the substrate. According to a further embodiment, the light source may be located on an opposite face of the substrate from which the capacitive sensor element may be located, whereby light shines through the substrate to illuminate the flexible cover.

According to a further embodiment, an alpha-numeric emblem may be provided on the flexible cover to indicate a function of an associated capacitive sensor element. According to a further embodiment, the alpha-numeric emblem may be silk screened onto the flexible cover. According to a further embodiment, the alpha-numeric emblem may be embossed into the flexible cover. According to a further embodiment, the alpha-numeric emblem may be stamped onto the flexible cover.

According to a further embodiment, the electrically conductive plane may be a layer of Indium Tin Oxide (ITO) disposed on a face of the flexible cover. According to a further embodiment, the electrically conductive plane may be a layer of Antimony Tin Oxide (ATO) disposed on a face of the flexible cover. According to a further embodiment, the electrically conductive plane may be a layer of Graphene disposed on a face of the flexible cover.

According to a further embodiment, the light source may be an electroluminescent (EL) layer. According to a further embodiment, the light source may be an organic light emitting diode (OLED) layer. According to a further embodiment, the light source may be an electrophoretic coating of light emitting material. According to a further embodiment, a light source may be located in the deformable space. According to a further embodiment, the light source may be at least one light emitting diode (LED).

According to a further embodiment, the capacitive sensor element may be coupled to an input of a capacitance value measurement circuit and the electrically conductive plane may be coupled to a power supply common or ground. According to a further embodiment, the capacitive sensor element may be coupled to a first input of a capacitance value measurement circuit, the electrically conductive plane may be coupled to second input of the capacitance value measurement circuit, and a switch may be coupled to the electrically conductive plane and a power supply common or ground, wherein when the switch may be closed the electrically conductive plane may be coupled to the power supply common or ground and when open the electrically conductive plane may be operational with the second input of the capacitance value measurement circuit.

According to a further embodiment, the substrate and the capacitive sensor element may be fabricated from a printed circuit board. According to a further embodiment, the substrate may be glass. According to a further embodiment, the substrate may be plastic. According to a further embodiment, the flexible cover may be metallic. According to a further embodiment, the flexible cover may be nonmetallic.

According to another embodiment, a user interface having a plurality of physical force capacitive touch sensors may comprise: a substrate; a plurality of capacitive sensor elements on a face of the substrate; a substantially non-deformable spacer surrounding each one of the plurality of capacitive sensor elements; and an electrically conductive plane having portions thereof proximate to respective ones of the plurality of capacitive sensor elements; wherein when a mechanical force may be applied to at least one portion of the electrically conductive plane it may be biased toward the respective at least one of the plurality of capacitive sensor elements, whereby the at least one of the plurality of capacitive sensor elements changes capacitance value. According to a further embodiment, the plurality of capacitive sensor elements may be arranged in a matrix.

According to yet another embodiment, a capacitive touch slider may comprise: a substrate; a plurality of capacitive sensor elements linearly arranged on a face of the substrate; a substantially non-deformable spacer on the substrate that surrounds the plurality of capacitive sensor elements; and an electrically conductive deformable plane proximate to the plurality of capacitive sensor elements; wherein when a mechanical force may be applied to a portion of the electrically conductive plane it may be biased toward at least one of the plurality of capacitive sensor elements, whereby the at least one of the plurality of capacitive sensor elements changes capacitance value. According to a further embodiment, a flexible cover may be provided over the electrically conductive deformable plane, wherein when the mechanical force may be applied to the flexible cover the electrically conductive deformable plane may be biased toward at least one of the plurality of capacitive sensor elements.

According to a further embodiment, a plurality of mini-pedestals may be located between the flexible cover and the electrically conductive deformable plane. According to a further embodiment, the plurality of mini-pedestals may be round. According to a further embodiment, the plurality of mini-pedestals may be square. According to a further embodiment, the plurality of mini-pedestals may be rectangular.

According to a further embodiment, a light source for illuminating a face of the electrically conductive deformable plane. According to a further embodiment, a light source may be provided for illuminating a face of the flexible cover. According to a further embodiment, the flexible cover and the electrically conductive deformable plane may be light transmissive.

According to a further embodiment, a capacitive measurement circuit having a plurality of inputs may be coupled to respective ones of the plurality of capacitive sensor elements. a digital processor may be coupled to the capacitive measurement circuit and may provide force positional information based upon determination of capacitance values of certain ones of the plurality of capacitive sensor elements.

According to a further embodiment, the digital processor and the capacitive measurement circuit may be part of a microcontroller.

According to still another embodiment, a capacitive touch pad may comprise: a substrate; a plurality of capacitive sensor elements arranged in a matrix on a face of the substrate; a substantially non-deformable spacer on the substrate that surrounds the plurality of capacitive sensor elements; and an electrically conductive deformable plane proximate to the plurality of capacitive sensor elements; wherein when a mechanical force may be applied to a portion of the electrically conductive plane it may be biased toward at least one of the plurality of capacitive sensor elements, whereby the at least one of the plurality of capacitive sensor elements changes capacitance value.

According to a further embodiment, a flexible cover may be provided over the electrically conductive deformable plane, wherein when the mechanical force may be applied to the flexible cover the electrically conductive deformable plane may be biased toward at least one of the plurality of capacitive sensor elements. According to a further embodiment, a plurality of mini-pedestals may be located between the flexible cover and the electrically conductive deformable plane. According to a further embodiment, the plurality of mini-pedestals may be round. According to a further embodiment, the plurality of mini-pedestals may be square. According to a further embodiment, the plurality of mini-pedestals may be rectangular.

According to a further embodiment, a light source for illuminating a face of the electrically conductive deformable plane. According to a further embodiment, a light source may be provided for illuminating a face of the flexible cover. According to a further embodiment, the flexible cover and the electrically conductive deformable plane may be light transmissive.

According to a further embodiment, a capacitive measurement circuit having a plurality of inputs may be coupled to respective ones of the plurality of capacitive sensor elements. According to a further embodiment, a digital processor may be coupled to the capacitive measurement circuit and provide force positional information based upon determination of capacitance values of certain ones of the plurality of capacitive sensor elements. According to a further embodiment, the digital processor and the capacitive measurement circuit may be part of a microcontroller.

According to another embodiment, a capacitive touch circular slider may comprise: a substrate; a plurality of capacitive sensor elements circularly arranged on a face of the substrate; a substantially non-deformable spacer on the substrate that surrounds the plurality of capacitive sensor elements; and an electrically conductive deformable plane proximate to the plurality of capacitive sensor elements; wherein when a mechanical force may be applied to a portion of the electrically conductive plane it may be biased toward at least one of the plurality of capacitive sensor elements, whereby the at least one of the plurality of capacitive sensor elements changes capacitance value.

According to a further embodiment, a flexible cover may be provided over the electrically conductive deformable plane, wherein when the mechanical force may be applied to the flexible cover the electrically conductive deformable plane may be biased toward at least one of the plurality of capacitive sensor elements. According to a further embodiment, a plurality of mini-pedestals may be located between the flexible cover and the electrically conductive deformable plane.

According to a further embodiment, a light source may be provided for illuminating a face of the electrically conductive deformable plane. According to a further embodiment, a light source may be provided for illuminating a face of the flexible cover. According to a further embodiment, the flexible cover and the electrically conductive deformable plane may be light transmissive.

According to a further embodiment, the capacitive touch circular slider may comprise: a capacitive measurement circuit having a plurality of inputs coupled to respective ones of the plurality of capacitive sensor elements; and a digital processor coupled to the capacitive measurement circuit and providing force positional information based upon determination of capacitance values of certain ones of the plurality of capacitive sensor elements. According to a further embodiment, the digital processor and the capacitive measurement circuit may be part of a microcontroller.

According to yet another embodiment, a physical force capacitive touch key may comprise: a substrate; first and second capacitive sensor elements on a face of the substrate; a substantially non-deformable spacer on the substrate that surrounds the first and second capacitive sensor elements; and an electrically conductive plane proximate to the first and second capacitive sensor elements; wherein when a mechanical force may be applied to the electrically conductive plane it may be biased toward the first and/or the second capacitive sensor elements, whereby at least one of the first and second capacitive sensor elements changes capacitance value.

According to a further embodiment, the capacitive touch circular slider may comprise: a capacitive measurement circuit having a plurality of inputs coupled to respective ones of the plurality of capacitive sensor elements; and a digital processor coupled to the capacitive measurement circuit and providing force positional information based upon determination of capacitance values of certain ones of the plurality of capacitive sensor elements. According to a further embodiment, the digital processor and the capacitive measurement circuit may be part of a microcontroller.

According to yet another embodiment, a physical force capacitive touch key may comprise: a substrate; first and second capacitive sensor elements on a face of the substrate; a substantially non-deformable spacer on the substrate that surrounds the first and second capacitive sensor elements; and an electrically conductive plane proximate to the first and second capacitive sensor elements; wherein when a mechanical force may be applied to the electrically conductive plane it may be biased toward the first and/or the second capacitive sensor elements, whereby at least one of the first and second capacitive sensor elements changes capacitance value. According to yet another embodiment, the electrically conductive plane may be flexibly deformable.

According to a further embodiment, a flexible cover may be provided over the electrically conductive plane, wherein when the mechanical force may be applied to the flexible cover the electrically conductive plane may be biased toward the first and/or the second capacitive sensor elements. According to a further embodiment, a pedestal may be provided between the flexible cover and the electrically conductive plane. According to a further embodiment, a deformable space around the first and second capacitive sensor elements may be created by the flexible cover and the substantially non-deformable spacer.

According to a further embodiment, the flexible cover may be light transmissive. According to a further embodiment, the electrically conductive plane may be light transmissive. According to a further embodiment, a light source may be provided for illuminating a face of the flexible cover.

According to a further embodiment, the physical force capacitive touch key may further comprise: a capacitive measurement circuit having a plurality of inputs coupled to the first and the second capacitive sensor elements; and a digital processor coupled to the capacitive measurement circuit and providing force positional information based upon determination of capacitance values of the first and second capacitive sensor elements. According to a further embodiment, the digital processor and the capacitive measurement circuit may be part of a microcontroller.

According to another embodiment, a physical force capacitive touch joystick may comprise: a substrate; at least three capacitive sensor elements on a face of the substrate; a substantially non-deformable spacer on the substrate that surrounds the least three capacitive sensor elements; a pedestal; and an electrically conductive plane attached to the pedestal and proximate to the at least three capacitive sensor elements; wherein when a mechanical force may be applied to the electrically conductive plane it may be biased toward at least one of the at least three capacitive sensor elements, whereby at least one of the at least three capacitive sensor elements changes capacitance value.

According to a further embodiment, a joy stick may be attached to the pedestal, wherein when a mechanical motion may be applied to the joy stick the mechanical force may be applied to the electrically conductive plane.

According to another embodiment, a capacitive touch cylindrical sensor may comprise: a substrate formed into a cylinder; a plurality of capacitive sensor elements arranged on an face of the cylindrical substrate; a substantially non-deformable spacer on the substrate that surrounds the plurality of capacitive sensor elements; and an electrically conductive deformable cylindrical sleeve proximate to the plurality of capacitive sensor elements; wherein when a mechanical force may be applied to a portion of the electrically conductive deformable cylindrical sleeve it may be biased toward at least one of the plurality of capacitive sensor elements, whereby the at least one of the plurality of capacitive sensor elements changes capacitance value.

According to a further embodiment, the capacitive touch slider may further comprise a flexible cover over the electrically conductive deformable cylindrical sleeve, wherein when the mechanical force may be applied to the flexible cover the electrically conductive deformable cylindrical sleeve may be biased toward at least one of the plurality of capacitive sensor elements.

BRIEF DESCRIPTION OF THE DRAWINGS

A more complete understanding of the present disclosure thereof may be acquired by referring to the following description taken in conjunction with the accompanying drawings wherein:

FIG. 7 illustrates a schematic elevational view of the capacitive touch keys shown in FIGS. 5 and 6;

FIG. 8 illustrates a schematic isometric exploded view of a capacitive touch key, according to yet another specific example embodiment of this disclosure;

FIG. 9 illustrates a schematic elevational view of the capacitive touch key shown in FIG. 8;

Figure 1:
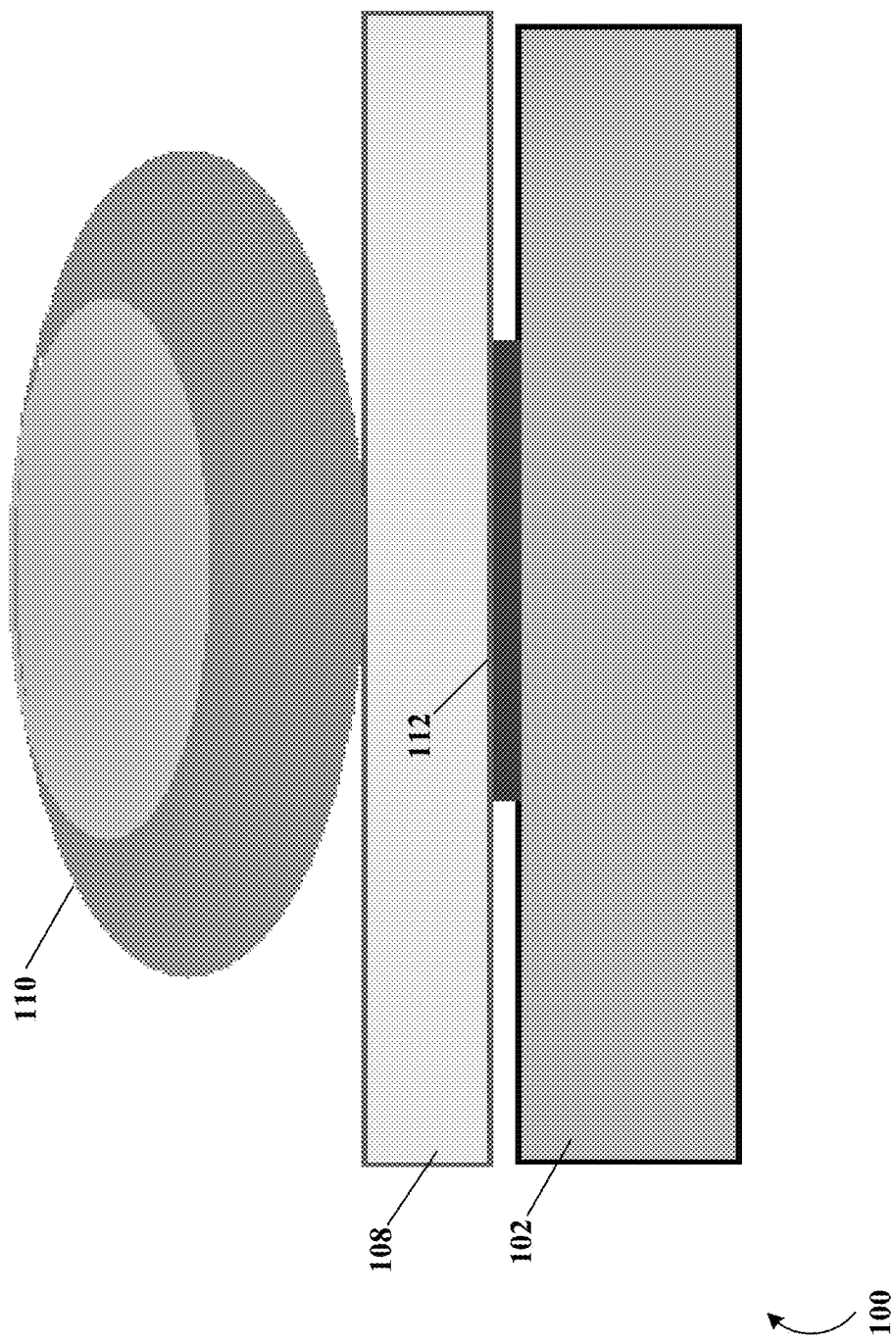
FIG. 1 is a schematic elevational view of a cross section of a prior technology capacitive touch sensor.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, a capacitive touch sensor comprises a capacitive sensor element on a substrate, a physically deformable electrically insulating spacer over the capacitive sensor element, and a conductive deformable plane over the physically deformable electrically insulating spacer that is substantially parallel to the capacitive sensor element. The conductive deformable plane is connected to a power supply common and/or grounded to form a capacitor with the capacitive sensor element and for improved shielding of the capacitive sensor element from electrostatic and electromagnetic disturbances, and false triggering thereof. A protective cover may be placed over the conductive deformable plane to act as an environmental seal for improved physical and weather protection, but is not essential to operation of the capacitive touch sensor.

When the user presses down onto the approximate area of a target (e.g., alpha/numeric and/or graphical) on the conductive plan of the capacitive touch sensor, the distance between the capacitive sensor element and the conductive deformable plane is reduced, thus changing the capacitance of the capacitive sensor element. A capacitance change detection circuit monitors the capacitance value of the capacitive sensor element, and when the capacitance value changes (e.g., increases) a sensor activation signal is generated.

The capacitive touch sensor, according to the teachings of this disclosure, is substantially immune to false triggering caused by a user in close proximity to the sensor target because a correct area of the conductive deformable plane must be slightly deformed in order for the capacitance of the capacitive sensor element to change. In addition, stray metallic objects will not substantially affect the capacitance of the capacitive sensor element for the same reason. Furthermore the assembly of the capacitive touch sensor can be sealed with the physically deformable electrically insulated spacer and may thus be substantially immune to fluid contamination thereof.

A molded spacer layer and a discrete conductive metal disk may be used for a capacitive target, according to the teachings of this disclosure. By using either reverser mount or side illuminating LED(s) with a suspended metal target, capacitive touch sensor keys or buttons may be backlit. Backlighting of capacitive touch sensor keys or buttons is especially desirable for use in appliances, automotive controls, consumer products such as television set top box converters for cable or satellite television reception, security entry pads, intercom buttons, computers, industrial control panels, etc. Backlighting of the keys or buttons may be used to indicate that the key or button has been pressed, e.g., visual feedback, and/or improved visibility under poor lighting conditions.

There are several things that are needed to complete backlighting for capacitive touch buttons. Capacitive touch buttons in most cases require that the metal deformable fascia be the target, but according to the teachings of this disclosure it would be moved away from the capacitive sensor plate to the point where it will not work as the target for changing the capacitance value of the touch sensor. To counteract this, a suspended target proximate to the capacitive sensor plate may be used. By configuring the lighted capacitive touch buttons as such, height may be added to the capacitive touch panel design that will allow placement of light emitting diodes (LEDs) on the top and/or bottom side(s) of the circuit board comprising the capacitive sensor plate.

By moving the front button layer farther from the substrate, e.g., capacitive touch printed circuit board (PCB), a molded plastic layer(s) may be used for light to pass therethrough and thereby provides for backlighting of the capacitive touch sensor buttons. A metallic target layer is attached and/or molded on the plastic layer proximate to the capacitive sensor plate. As this metallic target layer moves closer to the capacitive sensor plate when the button is depressed, the capacitance of the capacitive sensor thereby changes (increases) and is detected. The metallic target layer may also be used as a shield to prevent or reduce hot (bright) spots in the lighting of the capacitive touch sensor button.

The material that holds the suspended metallic target may be translucent and function as a light pipe for transmission of light from a light source, e.g., light emitting diodes (LEDs). This translucent material may also function as a seal for the holes that may now be placed in the metal cover to allow light to pass therethrough. The material that is used as the spacer surrounding the capacitive sensor plate may be of a non-translucent material so as to prevent bleeding of light from one adjacent key or button to the next.

The light source LEDs do not have to be mounted on the top side of the circuit board, as they can be mounted elsewhere as needed. Also the top layer does not have to be flat or even metal, and it may be curved or use an over-mold process for sealing of the button.

Referring now to the drawings, the details of example embodiments are schematically illustrated. Like elements in the drawings will be represented by like numbers, and similar elements will be represented by like numbers with a different lower case letter suffix.

Figure 2:
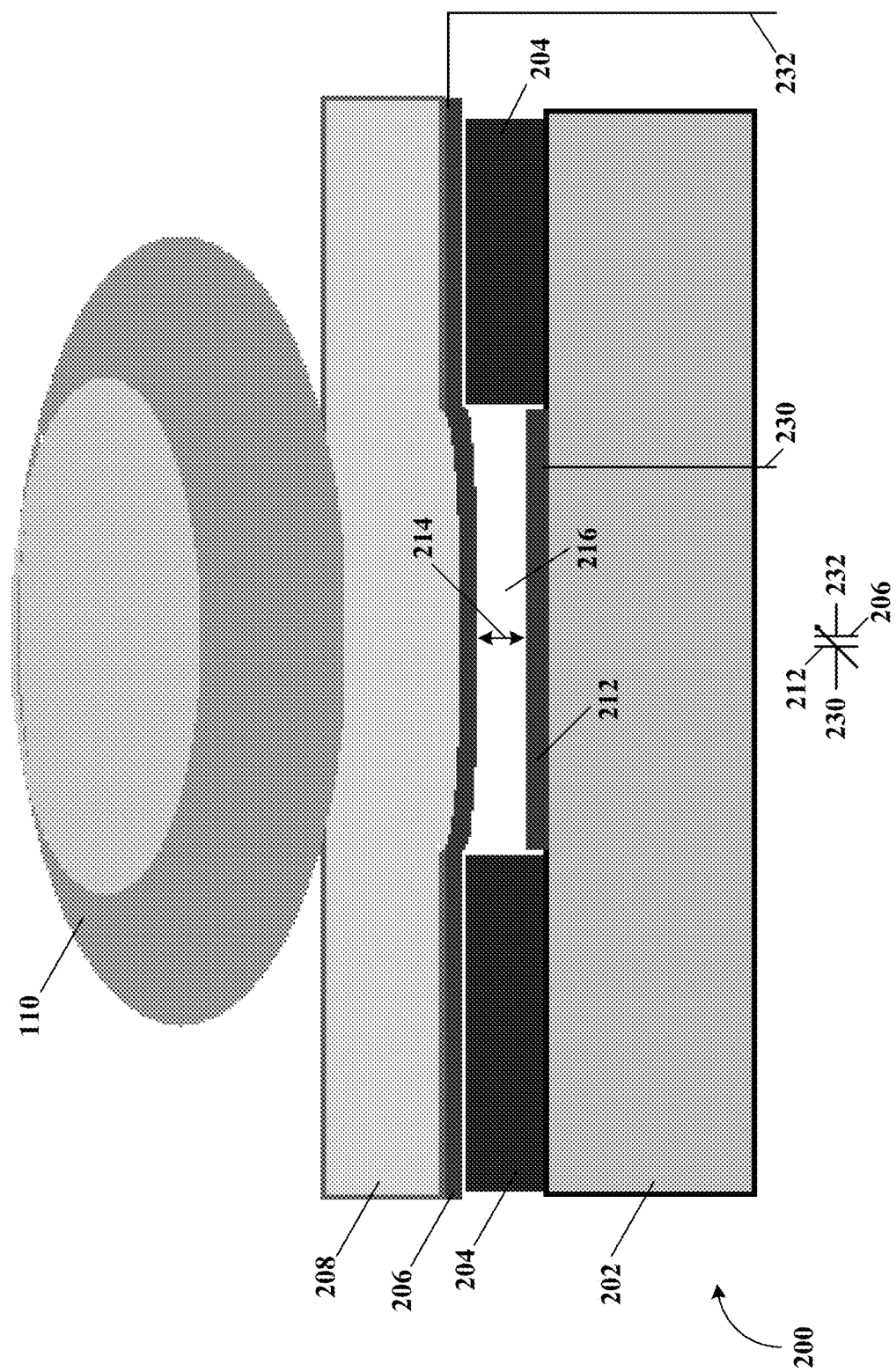
FIG. 2 is a schematic elevational view of a cross section of a capacitive touch sensor, according to specific example embodiments of this disclosure.

Referring to FIG. 2, depicted is a schematic elevational view of a cross section of a capacitive touch sensor, according to specific example embodiments of this disclosure. The capacitive touch sensor, generally represented by the numeral 200, comprises a substrate 202, a capacitive sensor element 212, a deformable space 216, a non-deformable spacer 204, a conductive deformable plane 206 and a protective deformable cover (fascia) 208. The conductive deformable plane 206 may be connected to a power supply common and/or grounded (not shown) to form a capacitor with the capacitive sensor element 212 and for improved shielding of the capacitive sensor element 212 from electrostatic disturbances and false triggering thereof. The protective deformable cover 208 may be used as an environmental seal for improved physical and weather protection, but is not essential to operation of the capacitive touch sensor 200. The deformable space 216 may be an opening in the non-deformable spacer 204 and may be filled with, for example but not limited to, air, nitrogen, elastic silicon rubber, etc.

Figure 4:
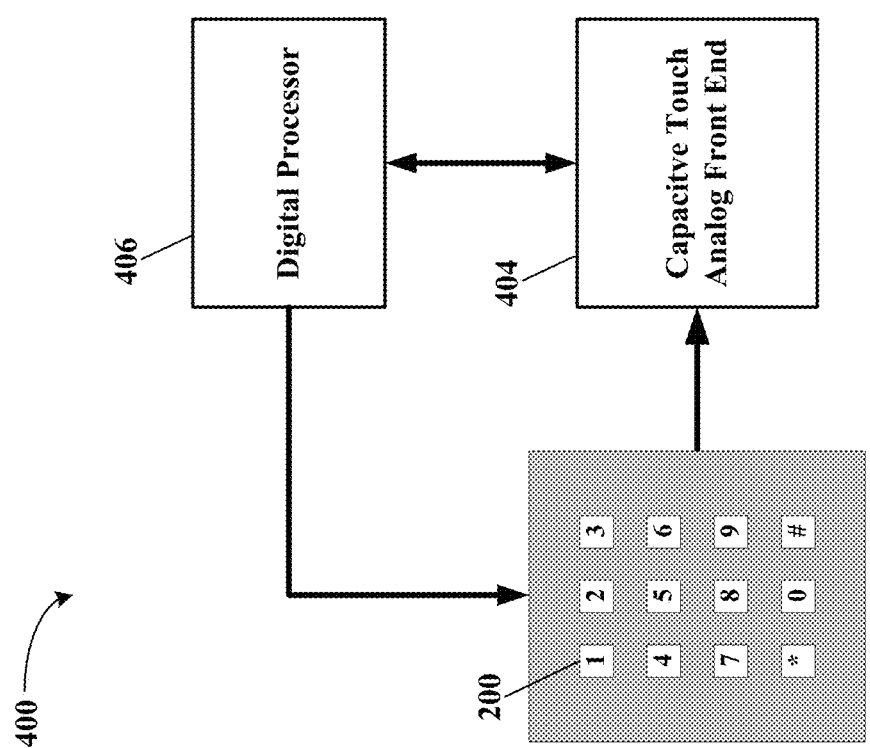
FIG. 4 illustrates a schematic block diagram of an electronic system having a capacitive touch keypad, a capacitive touch analog front end and a digital processor, according to the teachings of this disclosure.

The capacitive sensor element 212 may be connected through connection 230 to a capacitance measurement circuit, e.g., see FIG. 4 AFE 404, and the conductive deformable plane 206 is normally connected through connection 232 to the power supply common and/or ground. However, the conductive deformable plane 206 may be connected through connection 232 to a digital output of the digital processor 406 (FIG. 4) and used as both one plate of the capacitor formed with the capacitive sensor element 212 when grounded. Or the conductive deformable plane 206 may be connected to a capacitive measurement input of the AFE 404 when the digital output from the digital processor 406 is in a high impedance off state. For example the connection 232 is coupled to an input of the AFE 404 and the digital output is connected in parallel to the same input of the AFE 404. When the output is at a logic low, the conductive deformable plane 206 is at the power supply common, and when at a high impedance (off) the conductive deformable plane 206 may function as a capacitive sensor element similar to what is shown in FIG. 1. E.g., the digital output acts as a shunt switch that when closed shorts the conductive deformable plane 206 to ground and when open enables conductive deformable plane 206 to function as a capacitive sensor element 112 (e.g., see FIG. 1). This configuration for the conductive deformable plane 206 may be used as a proximity detector, e.g., as a user finger approaches the capacitive sensor (conductive deformable plane 206) a "system wakeup" signal can be generated in the digital processor 406 (FIG. 4).

The conductive deformable plane 206 and protective deformable cover 208 are physically deformable over the deformable space 216 so that when a force, e.g., a user's finger 110, presses down onto the approximate center of a target (e.g., alpha/numeric and/or graphical see FIG. 3) on the protective deformable cover 208 of the capacitive touch sensor 200, the distance 214 between the capacitive sensor element 212 and the conductive deformable plane 206 is reduced, thereby changing the capacitance of the capacitive sensor element 212. A capacitance change detection circuit (not shown) monitors the capacitance value of the capacitive sensor element 212, and when the capacitance value changes (e.g., increases) a sensor activation signal is generated (not shown). The conductive deformable plane 206 and protective deformable cover 208 may be one and the same, or the conductive deformable plane 206 may be plated, coated, attached, etc., to a face of the protective deformable cover 208 proximate to the capacitive sensor element 212.

The capacitive touch sensor 200 is substantially immune to false triggering caused by a user in close proximity to the sensor target because a correct area of the conductive deformable plane 206 must be deformed in order for the capacitance of the capacitive sensor element 212 to change, e.g., requires an actuation force from the user's finger 110. In addition, stray metallic objects will not substantially affect the capacitance of the capacitive sensor element 212 for the same reason. Furthermore the assembly of the capacitive touch sensor 200 can be sealed within the physically deformable electrically insulated space 216 and may thus be substantially immune to fluid contamination thereof. Also since the non-deformable spacers 204 surround the capacitive sensor element 212 and the physically deformable electrically insulated space 216, adjacent capacitive sensor elements 212 (see FIG. 3) will not be affected, e.g., substantially no capacitance change because the areas of the conductive deformable plane 206 over adjacent capacitive sensor elements 212 will not be substantially deformed.

The capacitive sensor element 212 is electrically conductive and may be comprised of metal such as, for example but not limited to, copper, aluminum, silver, gold, tin, and/or any combination thereof, plated or otherwise. The capacitive sensor element 212 may also be comprised of non-metallic conductive material. The substrate 202 and capacitive sensor element 212 may be, for example but are not limited to, a printed circuit board having conductive metal areas etched thereon, a ceramic substrate with conductive areas thereon, clear or translucent glass or plastic with conductive areas thereon, etc.

Figure 3:
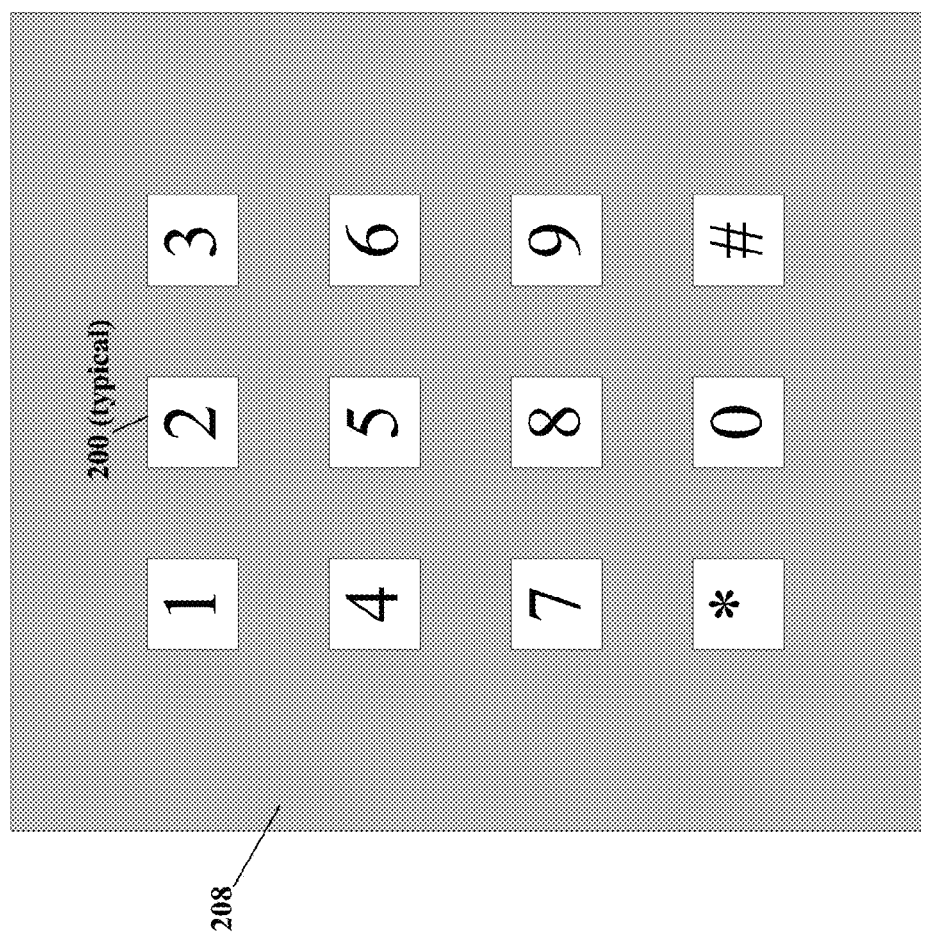
FIG. 3 is a schematic plan view of a user interface arranged as a data input matrix and having a plurality of capacitive touch sensors as shown in FIG. 2.

Referring to FIG. 3, depicted is a schematic plan view of a user interface arranged as a data input matrix and having a plurality of capacitive touch sensors as shown in FIG. 2. A plurality of capacitive touch sensors 200 are arranged in a matrix and have alpha-numeric representations indicating the functions thereof. When a mechanical force is applied any one of the capacitive touch sensors 200, a target area directly over the capacitive sensor element 212 of that one capacitive touch sensor 200 will be deformed by the mechanical force, bringing the conductive deformable plane 206 closer to the capacitive sensor element 212 and thereby changing (e.g., increasing) the capacitance thereof.

Referring to FIG. 4, depicted is a schematic block diagram of an electronic system having a capacitive touch keypad, a capacitive touch analog front end and a digital processor, according to the teachings of this disclosure. A digital processor 406, e.g., a microcontroller, microprocessor, microcomputer, digital signal processor (DSP), application specific integrated circuit (ASIC), programmable logic array (PLA), etc.; is coupled to a capacitive touch analog front end (AFE) 404 and a matrix of capacitive touch sensor keys 200, e.g., pushbuttons, levers, toggles, targets, handles, knobs, etc. The digital processor 406 and AFE 404 may be part of a mixed signal (analog and digital circuits) integrated circuit device, e.g., mixed signal capable microcontroller.

The capacitive touch AFE 404 facilitates, with a single low-cost integrated circuit device, all active functions used in determining when there is actuation of capacitive sensors, e.g., by pressing and deflecting a target key that changes the capacitance value of an associated capacitive sensor. The capacitive touch AFE 404 measures the capacitance value of each sensor of the matrix of capacitive touch sensor keys 200 and converts the capacitance values into respective analog direct current (dc) voltages that are read and converted into digital values with an analog-to-digital converter (ADC) (not shown) and sent to the digital processor 406. Various methods of measuring capacitance change may be used. For example, but not limited to, capacitance measurement using: a charge time measurement unit (CTMU), see Microchip Application Note AN1250; a capacitive sensing module (CSM), see Microchip TB3064 "mTouch™ Projected Capacitive Touch Screen Sensing Theory of Operation"; a capacitive voltage divider (CVD) measurement, see Microchip Application Note AN1298; wherein all are hereby incorporated by reference herein and available at www.microchip.com.

The digital processor 406 may supply clock and control functions to the capacitive touch AFE 404, read the analog voltage detector output of the capacitive touch AFE 404, and select each key of the matrix of capacitive touch sensor keys 200. When actuation of a key of the matrix of capacitive touch sensor keys 200 is determined, the digital processor 406 will take an appropriate action. The key (touch buttons) of the matrix of capacitive touch sensor keys 200 may be illuminated, as more fully described hereinafter.

Figure 5:
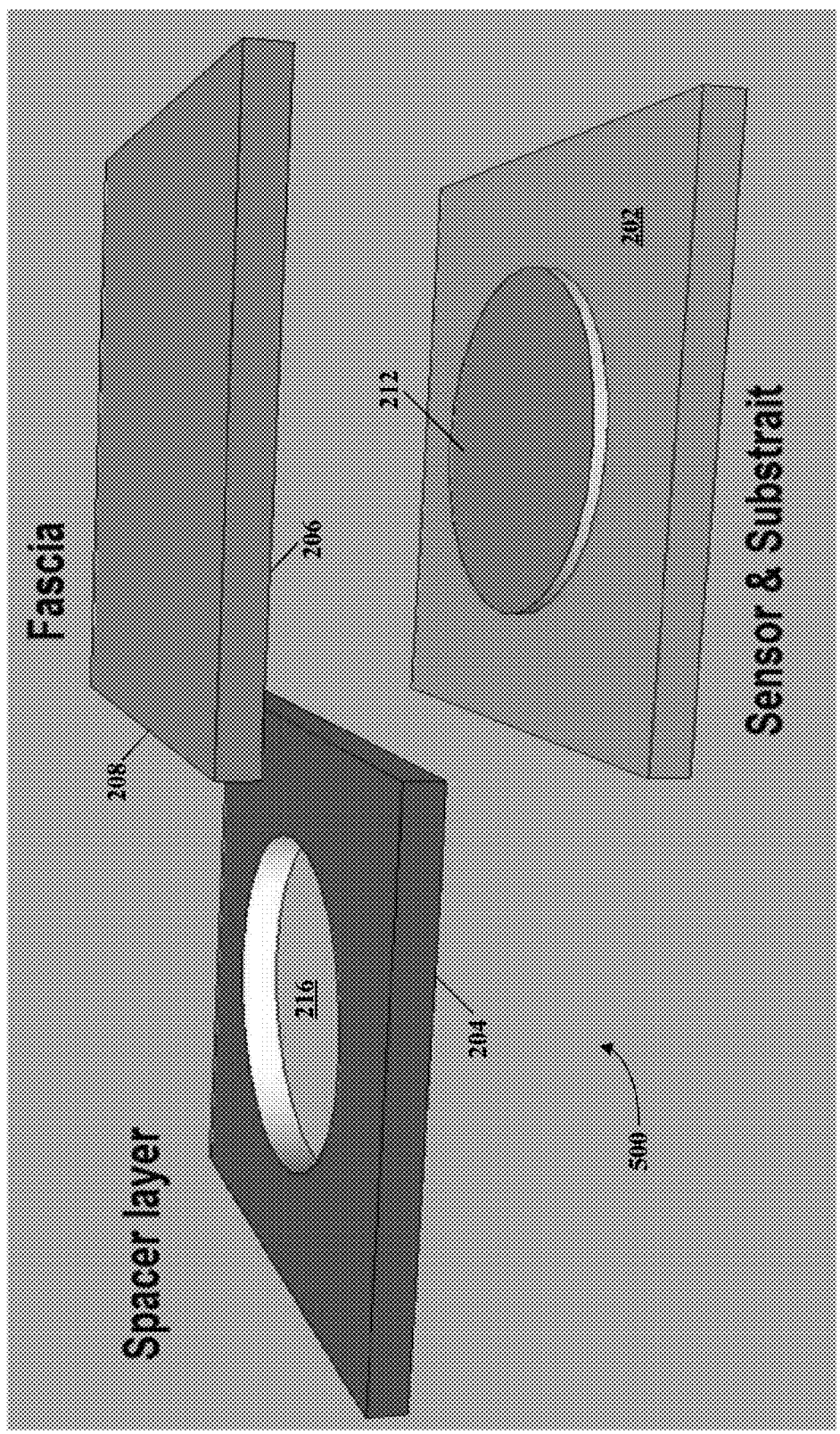
FIG. 5 illustrates a schematic isometric exploded view of a capacitive touch key, according to a specific example embodiment of this disclosure.

Referring to FIG. 5, depicted is a schematic isometric exploded view of a capacitive touch key, according to a specific example embodiment of this disclosure. The capacitive touch sensor, generally represented by the numeral 500, comprises a substrate 202, a capacitive sensor element 212, a deformable space 216, a substantially non-deformable spacer 204, a conductive deformable plane 206 and a protective deformable cover 208. The conductive deformable plane 206 may be connected to a power supply common and/or grounded (not shown) to form a capacitor with the capacitive sensor element 212 and for improved shielding of the capacitive sensor element 212 from electrostatic disturbances and false triggering thereof. The protective deformable cover 208 may be used as an environmental seal for improved physical and weather protection, but is not essential to operation of the capacitive touch sensor 200. The deformable space 216 may be an opening in the substantially non-deformable spacer 204 and may be filled with, for example but not limited to, air, nitrogen, elastic silicon rubber, etc.

The conductive deformable plane 206 and protective deformable cover 208 are physically deformable over the deformable space 216 so that when a user's finger 110 presses down onto the approximate center of a target (e.g., alpha/numeric and/or graphical see FIG. 3) on the conductive deformable plan 206 of the capacitive touch sensor 200, the distance between the capacitive sensor element 212 and the conductive deformable plane 206 is reduced, thereby changing the capacitance of the capacitive sensor element 212. A capacitance change detection circuit (not shown) monitors the capacitance value of the capacitive sensor element 212, and when the capacitance value changes (e.g., increases) a sensor activation signal is generated (not shown). The conductive deformable plane 206 and protective deformable cover 208 may be one and the same, or the conductive deformable plane 206 may be plated, coated, attached, etc., to a face of the protective deformable cover 208 proximate to the capacitive sensor element 212.

The capacitive touch sensor 200 is substantially immune to false triggering caused by a user in close proximity to the sensor target because a correct area of the conductive deformable plane 206 must be deformed in order for the capacitance of the capacitive sensor element 212 to change, e.g., requires an actuation force from the user's finger 110. In addition, stray metallic objects will not substantially affect the capacitance of the capacitive sensor element 212 for the same reason. Furthermore the assembly of the capacitive touch sensor 200 can be sealed within the physically deformable electrically insulated space 216 and may thus be substantially immune to fluid contamination thereof. Also since the substantially non-deformable spacer 204 surrounds the capacitive sensor element 212 and the physically deformable electrically insulated space 216, adjacent capacitive sensor elements 212 (see FIG. 3) will not be affected, e.g., no capacitance change because areas of the conductive deformable plane 206 over adjacent capacitive sensor elements 212 will not be deformed.

The capacitive sensor element 212 is electrically conductive and may be comprised of metal such as, for example but not limited to, copper, aluminum, silver, gold, tin, and/or any combination thereof, plated or otherwise. The capacitive sensor element 212 may also be comprised of non-metallic conductive material. The substrate 202 and capacitive sensor element 212 may be, for example but are not limited to, a printed circuit board having conductive metal areas etched thereon, a ceramic substrate with conductive areas thereon, clear or translucent glass or plastic with conductive areas thereon, etc.

The substrate 202, capacitive sensor element 212, conductive deformable plane 206 and/or protective deformable cover 208 (deformable fascia) may be light transmissive for light to pass therethrough. Non-conductive light transmissive material, e.g., glass, plastic, etc., may be used for the substrate 202 and the protective deformable cover 208, and conductive material, e.g., indium tin oxide (ITO), antimony tin oxide (ATO), graphene, etc., may be used for the capacitive sensor element 212 and conductive deformable plane 206. A light source may be positioned on an face of the substrate opposite the capacitive sensor element 212 and/or inside of the deformable space 216.

Figure 6:
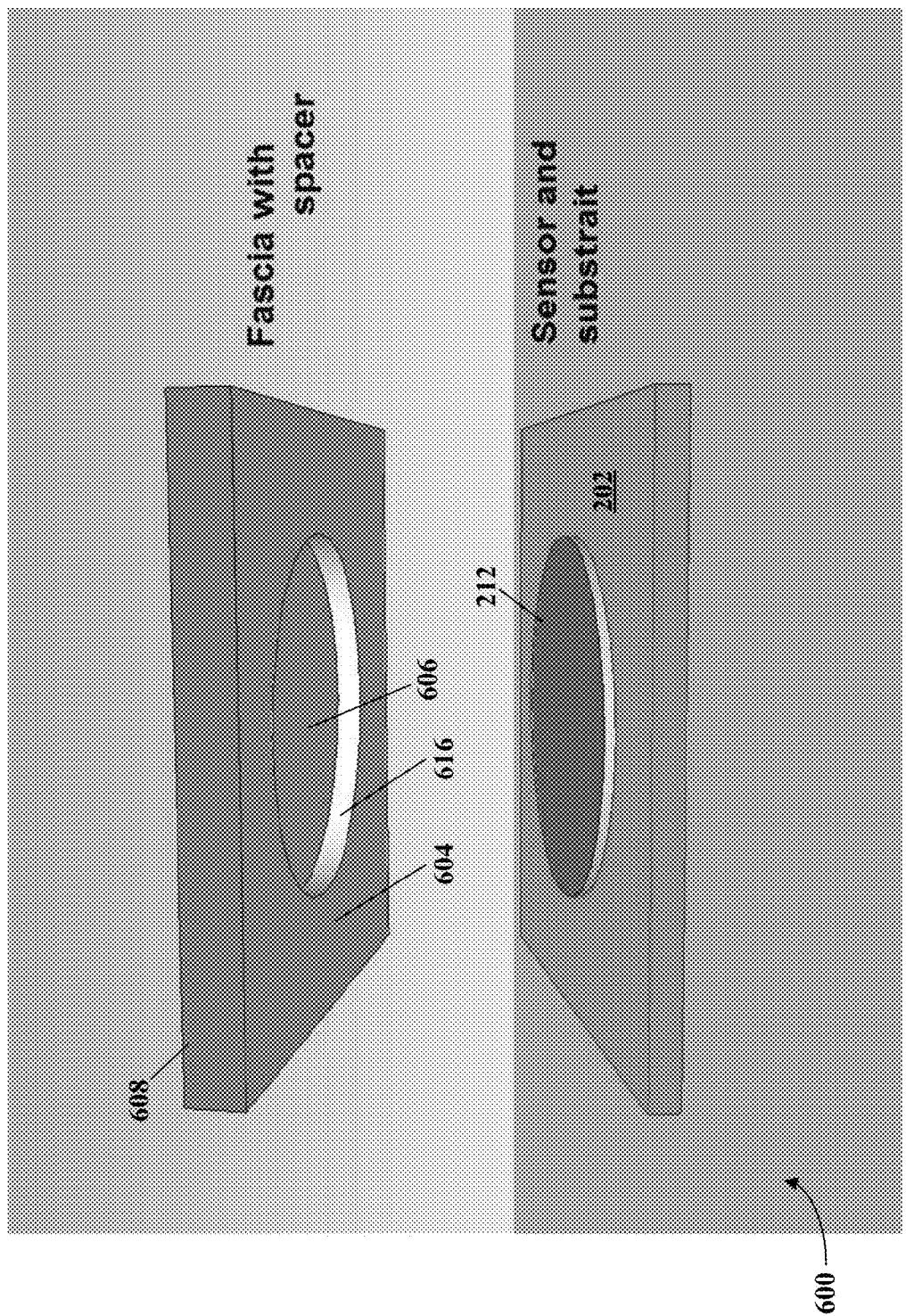
FIG. 6 illustrates a schematic isometric exploded view of a capacitive touch key, according to another specific example embodiment of this disclosure.

Referring to FIGS. 6 and 7, depicted are schematic isometric exploded and elevational views, respectively, of a capacitive touch key, according to another specific example embodiment of this disclosure. The capacitive touch sensor, generally represented by the numeral 600, comprises a substrate 202, a capacitive sensor element 212, a substantially non-deformable spacer 604, and a deformable cover 608 (fascia). The deformable cover 608 has a deformable space 216 formed therein and a conductive deformable plane 606 thereon. Formation of the deformable space 616 in the deformable cover 608 may be by, for example but limited to, etching, stamping, milling, etc. The conductive deformable plane 606 may be part of a portion of a face of the deformable cover 608 proximate to the capacitive sensor element 212 if the deformable cover 608 is conductive, or may be a conductive material that is, for example but is limited to, plated, painted, vapor disposed, etc., onto the face of the deformable cover 608.

The portion of the deformable cover 608 having the space 616 formed therein is deformable (flexible) so that the conductive deformable plane 606 will be moved towards the capacitive sensor element 212 when force 750 is applied to that portion of the deformable cover 608. The other portion of the deformable cover 608 over the substantially non-deformable spacer 604 is not as flexible as the portion over the deformable space 616 and will not deform as much, thereby isolating any capacitive change to the capacitive sensor element 212 under just the portion of the deformable fascia cover 608 having the force 750 applied thereto.

The deformable cover 608 may be used as an environmental seal for improved physical and weather protection. The deformable cover 608 may be light transmissive, and may have selectable areas thereof illuminated based upon actuation of capacitive sensor elements 212 in those areas. The substrate 202 may also be light transmissive. Materials for the deformable cover 608, conductive deformable plane 606, capacitive sensor element 212 and substrate 202 may be as described more fully hereinabove.

Referring to FIGS. 8 and 9, depicted are schematic isometric exploded and elevational views, respectively, of a capacitive touch key, according to yet another specific example embodiment of this disclosure. The capacitive touch sensor, generally represented by the numeral 800, comprises a substrate 202, a capacitive sensor element 212, a substantially non-deformable spacer 804, a conductive plane 820 (target), a pedestal 830 and a deformable cover 808. Formation of the deformable space 816 in the deformable cover 808 may be by, for example but limited to, etching, stamping, milling, etc. The pedestal 830 may be attached to an inside face of the deformable cover 808 and inside of the space 816. The conductive plane 820 (target) may be attached to the pedestal 830 and located between the pedestal 830 and the capacitive sensor element 212.

The portion of the deformable cover 808 having the space 816 formed therein is deformable (flexible) so that the conductive plane 820 and pedestal 830 will move towards the capacitive sensor element 212 when force 750 is applied to that portion of the deformable cover 808. The other portion of the deformable cover 808 over the spacer 804 is not as flexible as the portion over the space 816 and will not deform as much, thereby isolating any capacitive change to the capacitive sensor element 212 under just the portion of the deformable cover 808 having the force 750 applied thereto.

The deformable cover 808 may be used as an environmental seal for improved physical and weather protection. The deformable cover 808 may be light transmissive, and may have selectable areas thereof illuminated based upon actuation of capacitive sensor elements 212 in those areas. The substrate 202 may also be light transmissive. Materials for the deformable cover 808, conductive plane 820, capacitive sensor element 212 and substrate 202 may be as described more fully hereinabove. The pedestal 830 allows more room in the space 816 (more height) and use of a thin and opaque conductive material for the conductive plane 820. A light source (not shown) may be placed in the space 816 and light will be dispersed therein so as to light up the portion of the deformable cover 808 over the space 816.

Figure 10:
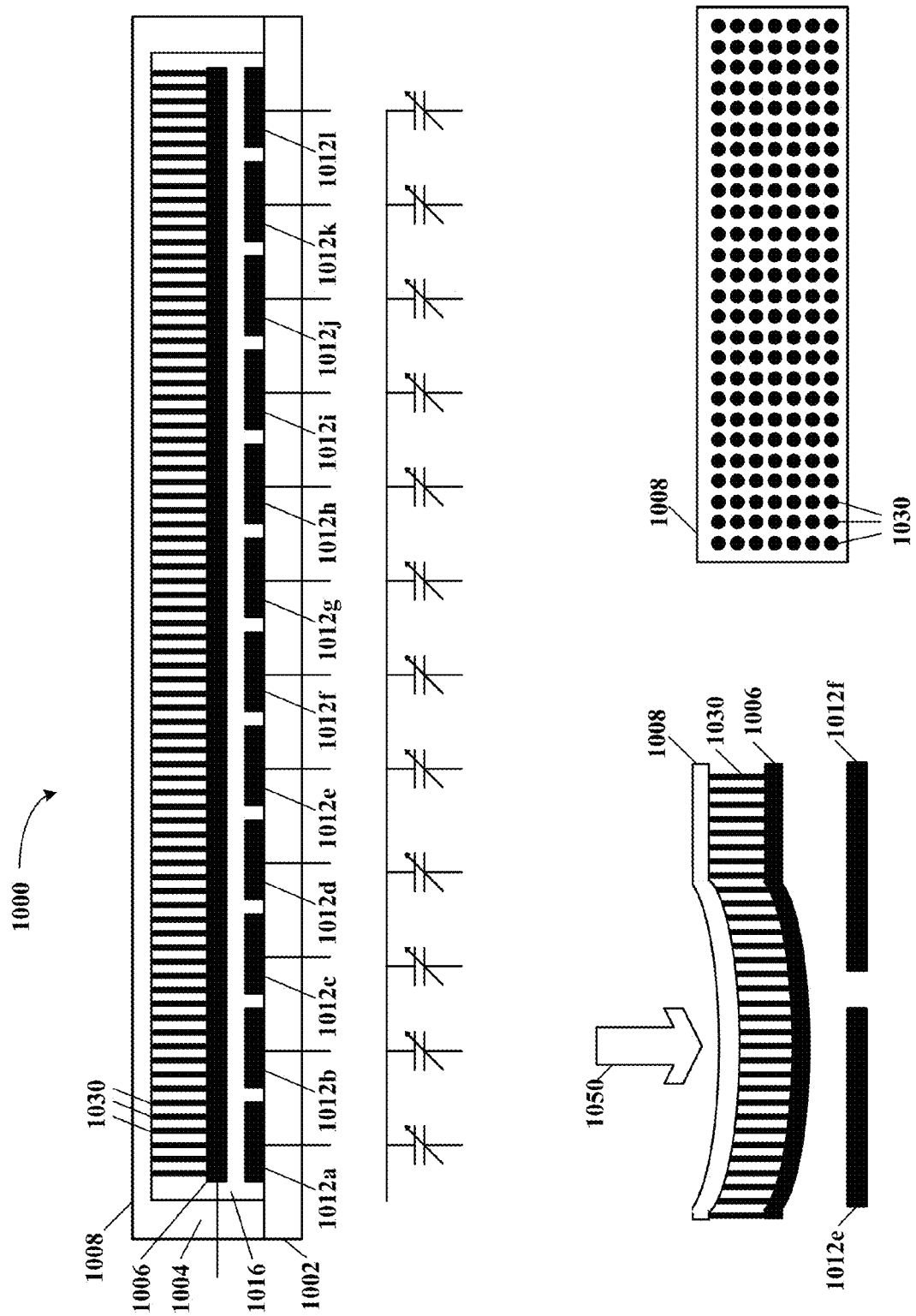
FIG. 10 illustrates schematic elevational and plan views of a capacitive touch slider, according to still another specific example embodiment of this disclosure.

Referring to FIG. 10, depicted are schematic elevational and plan views of a capacitive touch slider, according to still another specific example embodiment of this disclosure. The capacitive touch slider, generally represented by the numeral 1000, comprises a substrate 1002, a plurality of capacitive sensor elements 1012, a conductive deformable plane 1006, a substantially non-deformable spacer 1004, a plurality of mini-pedestals 1030, a protective deformable cover 1008 and a deformable space 1016. The plurality of mini-pedestals 1030 may be attached to an inside face of the deformable cover 1008 and inside of the space 1016. The conductive deformable plane 1006 may be attached to the plurality of mini-pedestals 1030 and located between the plurality of mini-pedestals 1030 and the plurality of capacitive sensor elements 1012.

The deformable cover 1008 is flexible so that a portion of the conductive deformable plane 1006 and a portion of the plurality of mini-pedestals 1030 will move toward at least one of the plurality of capacitive sensor elements 1012 when a force 1050 is applied to that portion of the deformable cover 1008. The capacitance value(s) of at least one of the plurality of capacitive sensor elements 1012 will thereby change, e.g., increase, and detection of this capacitance change may be done with a detection circuit similar to the one shown in FIG. 4. Depending upon the location of the force 1050, more than one of the plurality of capacitive sensor elements 1012 may change capacitance values. A finer granularity positional location of the force 1050 applied may be determined by the capacitance value changes of these more than one of the plurality of capacitive sensor elements 1012, e.g., taking the ratio-metric capacitance values thereof.

The deformable cover 1008 may be used as an environmental seal for improved physical and weather protection. The deformable cover 1008 may be light transmissive, and may have selectable areas thereof illuminated based upon actuation of the plurality of capacitive sensor elements 1012 in those areas. The substrate 1002 may also be light transmissive. Materials for the deformable cover 1008, conductive deformable plane 1006, plurality of capacitive sensor elements 1012 and substrate 1002 may be as described more fully hereinabove. At least one light source (see FIG. 11) may be placed in the space 1016 and light may be dispersed therein so as to light up that portion of the deformable cover 1008 having the force 1050 applied thereto.

The plurality of mini-pedestals 1030 may be of any number, shape or size, e.g., round, square, rectangular, etc. Improved granularity of positional location force determination may be obtained by using a greater number and smaller size for the plurality of mini-pedestals 1030. Comparison of the capacitance value changes of adjacent ones of the plurality of capacitive sensor elements 1012 may be used in more precisely locating a smaller area of the deformable cover 1008 than the area of a single one of the plurality of capacitive sensor elements 1012, e.g., ratio-metric comparison of the capacitance values of adjacent ones of the plurality of capacitive sensor elements 1012.

Figure 11:
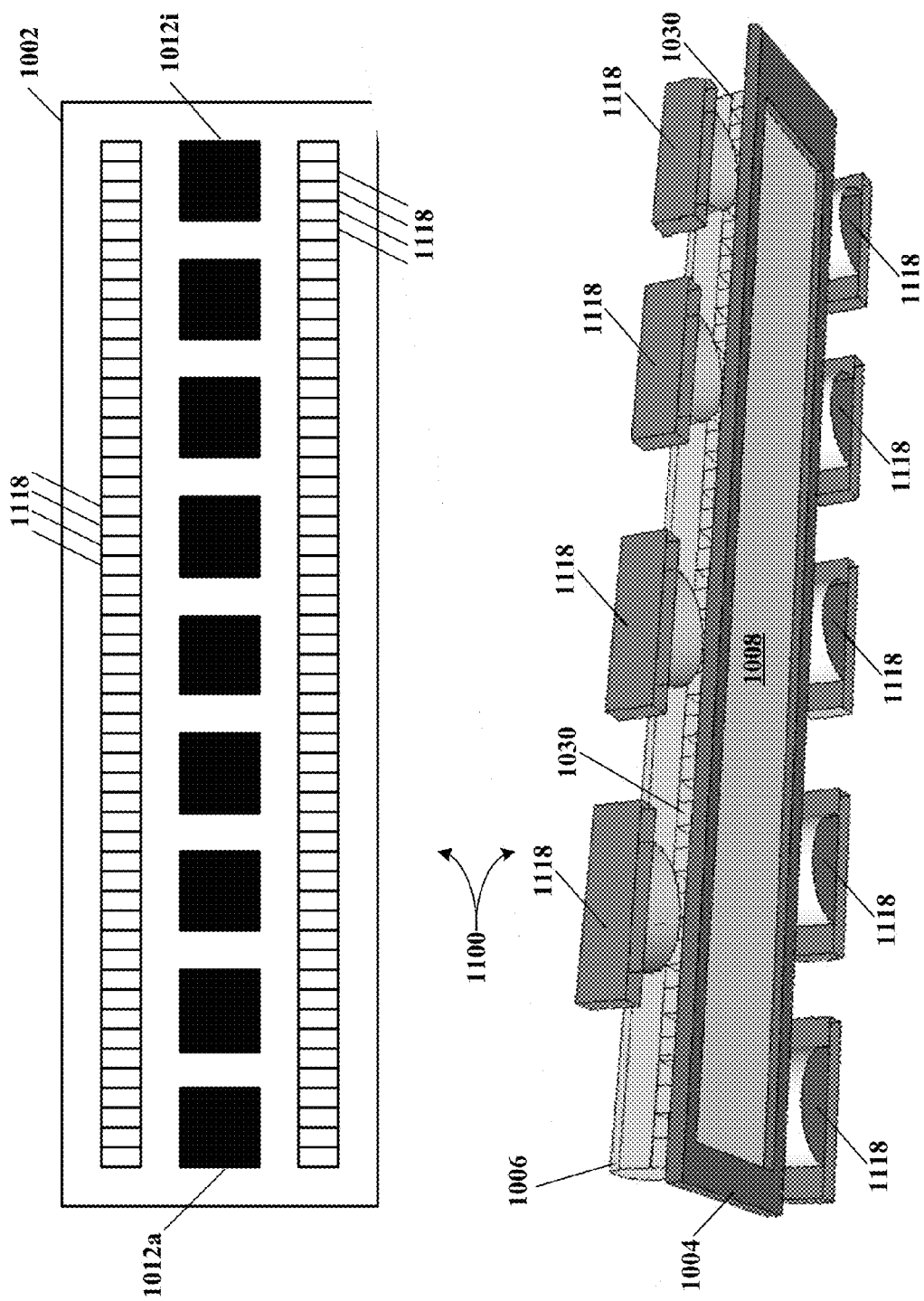
FIG. 11 illustrates schematic plan and isometric views of the capacitive touch slider shown in FIG. 10 and having a plurality of light emitting diodes for positional illumination of a touch or gesture.

Referring to FIG. 11, depicted are schematic plan and isometric views of the capacitive touch slider shown in FIG. 10 and having a plurality of light emitting diodes for positional illumination of a touch or gesture. Light sources 1118, e.g., light emitting diodes (LEDs) may be placed adjacent the plurality of capacitive sensor elements 1012, and used as illumination and/or visual feedback of the location(s) of the touch or gesture force.

Figure 12:
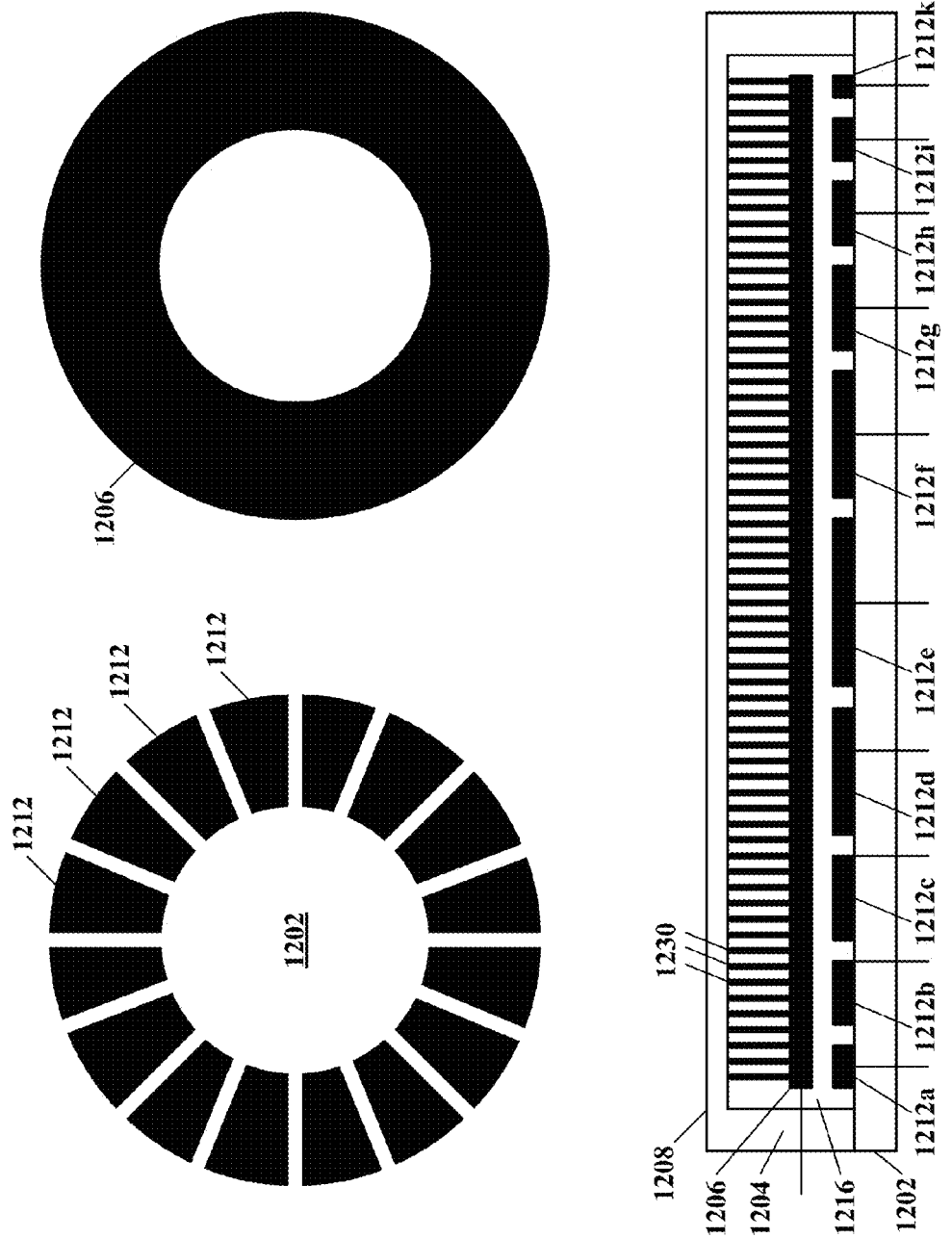
FIG. 12 illustrates schematic elevational and plan views of a capacitive touch circular slider, according to another specific example embodiment of this disclosure.

Referring to FIG. 12, depicted are schematic elevational and plan views of a capacitive touch circular slider, according to another specific example embodiment of this disclosure. The capacitive touch circular slider, generally represented by the numeral 1200, comprises a substrate 1202, a plurality of capacitive sensor elements 1212, a conductive deformable plane 1206, a substantially non-deformable spacer 1204, a plurality of mini-pedestals 1230, a protective deformable cover 1208 and a deformable space 1216. The plurality of mini-pedestals 1230 may be attached to an inside face of the deformable cover 1208 and inside of the space 1216. The conductive deformable plane 1206 may be attached to the plurality of mini-pedestals 1230 and located between the plurality of mini-pedestals 1230 and the plurality of capacitive sensor elements 1212.

The deformable cover 1208 is flexible so that a portion of the conductive deformable plane 1206 and a portion of the plurality of mini-pedestals 1230 will move toward at least one of the plurality of capacitive sensor elements 1212 when a force (1050) is applied to that portion of the deformable cover 1208. The capacitance value(s) of at least one of the plurality of capacitive sensor elements 1212 will thereby change, e.g., increase, and detection of this capacitance change may be done with a detection circuit similar to the one shown in FIG. 4. Depending upon the location of the force (1050), more than one of the plurality of capacitive sensor elements 1212 may change capacitance values. A finer granularity positional location of the force (1050) applied may be determined by the capacitance value changes of these more than one of the plurality of capacitive sensor elements 1212, e.g., taking the ratio-metric capacitance values thereof.

The deformable cover 1208 may be used as an environmental seal for improved physical and weather protection. The deformable cover 1208 may be light transmissive, and may have selectable areas thereof illuminated based upon actuation of the plurality of capacitive sensor elements 1212 in those areas. The substrate 1202 may also be light transmissive. Materials for the deformable cover 1208, conductive deformable plane 1206, plurality of capacitive sensor elements 1212 and substrate 1202 may be as described more fully hereinabove. At least one light source (see FIG. 11) may be placed in the space 1216 and light may be dispersed therein so as to light up that portion of the deformable cover 1208 having the force (1050) applied thereto.

The plurality of mini-pedestals 1230 may be of any number, shape or size, e.g., round, square, rectangular, etc. Improved granularity of positional location force determination may be obtained by using a greater number and smaller size for the plurality of mini-pedestals 1230. Comparison of the capacitance value changes of adjacent ones of the plurality of capacitive sensor elements 1212 may be used in more precisely locating a smaller area of the deformable cover 1208 than the area of a single one of the plurality of capacitive sensor elements 1212, e.g., ratio-metric comparison of the capacitance values of adjacent ones of the plurality of capacitive sensor elements 1212. It is contemplated and within the scope of this disclosure that the shape of the capacitive touch circular slider 1200 may be, for example but not limited to, oval, ellipsoid, square, triangular, etc.

Figure 13:
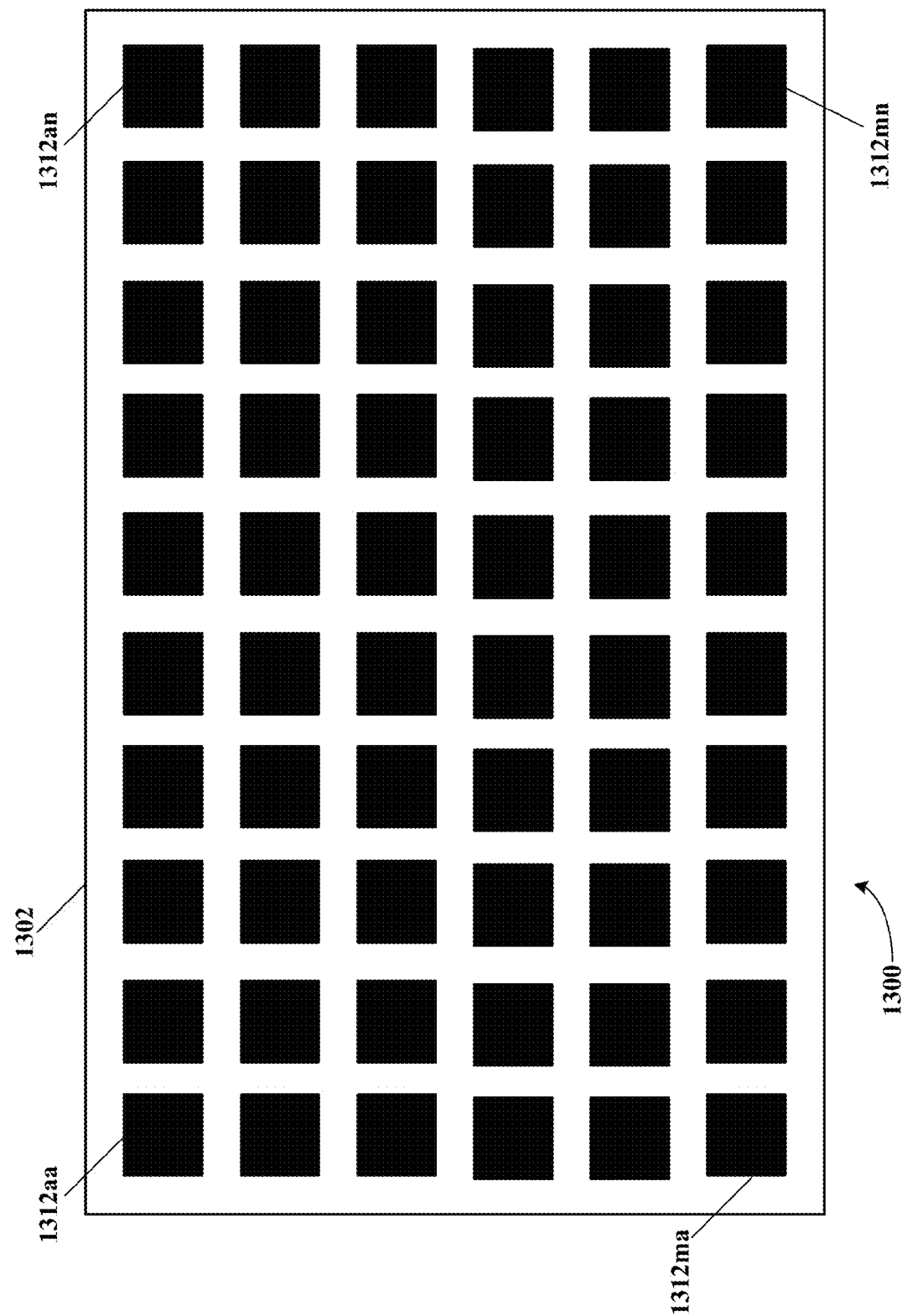
FIG. 13 illustrates a schematic plan view of a capacitive touch pad, according to another specific example embodiment of this disclosure.

Referring to FIG. 13, depicted is a schematic plan view of a capacitive touch pad, according to another specific example embodiment of this disclosure. The capacitive touch pad, generally represented by the numeral 1300, comprises a substrate 1302, a plurality of capacitive sensor elements 1312 arranged in an m×n matrix, a substantially non-deformable spacer (e.g., similar to the spacer 1004 shown in FIG. 10) surrounding the plurality of capacitive sensor elements 1312, a conductive deformable plane (e.g., similar to plane 1006 shown in FIG. 10), a plurality of mini-pedestals (e.g., similar to the plurality of mini-pedestals 1030 shown in FIG. 10), and a protective deformable cover (e.g., similar to the protective deformable cover 1008 of FIG. 10) and a deformable space (e.g., similar to the deformable space 1016 shown in FIG. 10). The plurality of mini-pedestals may be attached to an inside face of the deformable cover and inside of the space. The conductive deformable plane may be attached to the plurality of mini-pedestals and located between the plurality of mini-pedestals and the plurality of capacitive sensor elements 1312. The capacitive touch pad 1300 operates in substantially the same way as the capacitive touch sliders 1000 and 1200 shown in FIGS. 10-12 and described more fully hereinabove. Similar elements thereof will be referenced as appropriate numbers in parenthesis hereinafter.

The deformable cover (1008) is flexible so that a portion of the conductive deformable plane (1006) and a portion of the plurality of mini-pedestals (1030) will move toward at least one of the plurality of capacitive sensor elements 1312 when a force (1050) is applied to that portion of the deformable cover (1008). The capacitance value(s) of at least one of the plurality of capacitive sensor elements 1312 will thereby change, e.g., increase, and detection of this capacitance change may be done with a detection circuit similar to the one shown in FIG. 4. Depending upon the location of the force (1050), more than one of the plurality of capacitive sensor elements 1312 may change capacitance values. A finer granularity positional location of the force (1050) applied may be determined by the capacitance value changes of these more than one of the plurality of capacitive sensor elements 1312, e.g., taking the ratio-metric capacitance values thereof.

The deformable cover (1008) may be used as an environmental seal for improved physical and weather protection. The deformable cover (1008) may be light transmissive, and may have selectable areas thereof illuminated based upon actuation of the plurality of capacitive sensor elements 1312 in those areas. The substrate 1302 may also be light transmissive. Materials for the deformable cover (1008), conductive deformable plane (1006), plurality of capacitive sensor elements 1312 and substrate 1302 may be as described more fully hereinabove. At least one light source (see FIG. 11) may be placed in the space (1016) and light will be dispersed therein so as to light up that portion of the deformable cover (1008) having the force (1050) applied thereto.

The plurality of mini-pedestals (1030) may be of any number, shape or size, e.g., round, square, rectangular, etc.

Improved granularity of positional location force determination may be obtained by using a greater number and smaller size for the plurality of mini-pedestals (1030). Comparison of the capacitance value changes of adjacent ones of the plurality of capacitive sensor elements 1312 may be used in more precisely locating a smaller area of the deformable cover (1008) than the area of a single one of the plurality of capacitive sensor elements 1312, e.g., ratiometric comparison of the capacitance values of adjacent ones of the plurality of capacitive sensor elements 1312.

The capacitive touch sliders 1000 and 1200 may be utilized as a linear control like an analog slider, e.g., potentiometer, light dimmer, volume control, etc. The capacitive touch pad 1300 may be utilized in the same fashion as the capacitive touch sliders 1000 and 1200 with the additional capabilities of a two dimensional tablet. It is contemplated and within the scope of this disclosure that both the capacitive touch sliders 1000 and 1200, and the capacitive touch pad 1300 may be used to detect both force touches and force gestures on and across the deformable cover that affects capacitance value changes in at least one of the plurality of capacitive sensor elements 1012, 1212, 1312.

It is contemplated and within the scope of this disclosure that the capacitive touch pad may be shaped into a cylinder, wherein the plurality of capacitive sensor elements are mounted around the circumference of a cylindrical substrate with a deformable (flexible) outer cylindrical cover therearound so that when held in a user's hand the fingers of the user will change the capacitance values of certain ones of the plurality of capacitive sensor elements 1312, e.g., whereby when the user squeezes the cylindrical outer cover and rotates the hand the certain ones of the plurality of capacitive sensor elements will change capacitance values thereof and may be used in determining hand rotation and location thereon.

Figure 14:
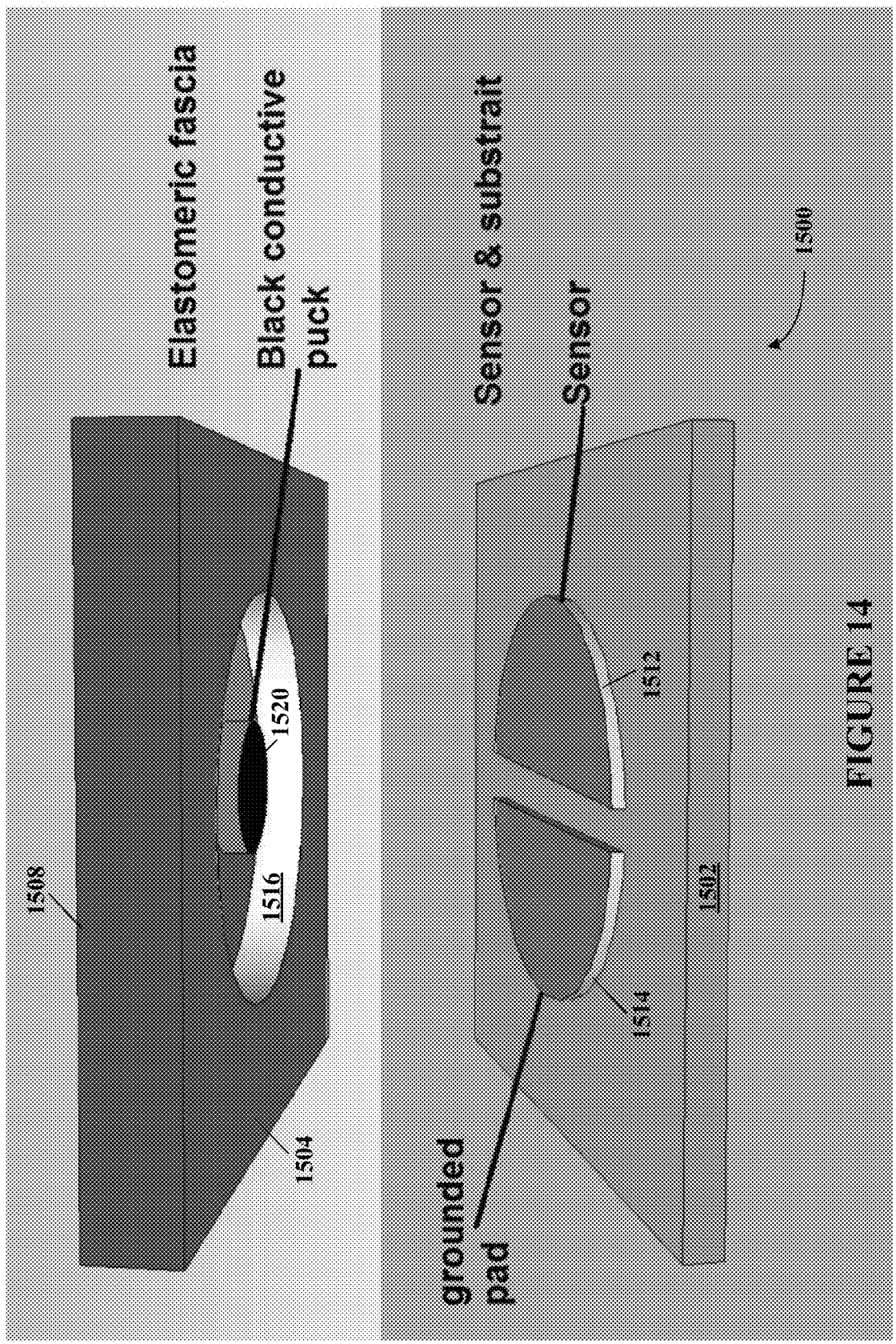
FIG. 14 illustrates a schematic exploded isometric view of a capacitive touch key, according to yet another specific example embodiment of this disclosure.
Figure 15:
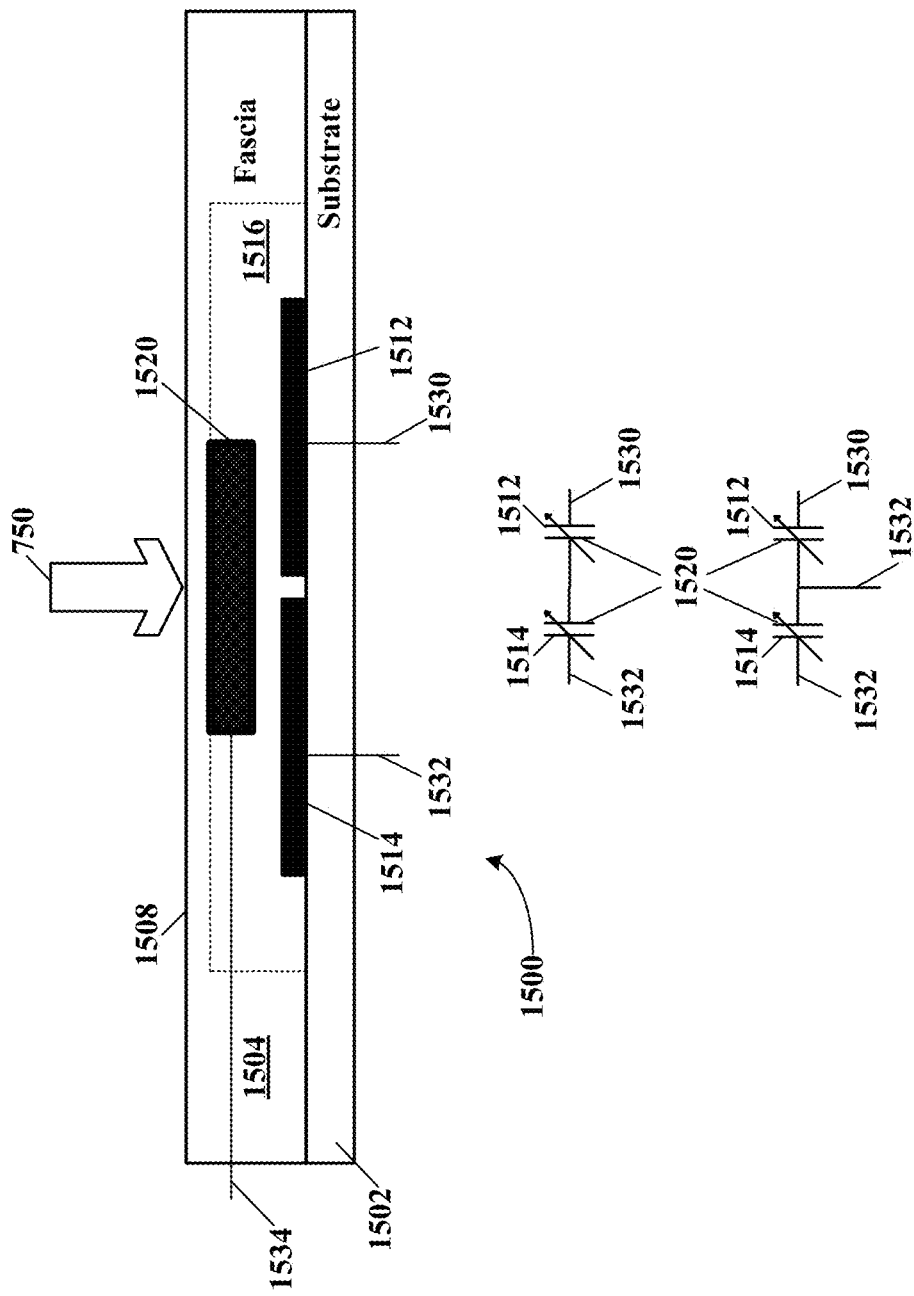
FIG. 15 illustrates a schematic elevational view of the capacitive touch key shown in FIG. 14.

Referring to FIGS. 14 and 15, depicted are schematic exploded isometric and elevational views, respectively, of a capacitive touch key, according to yet another specific example embodiment of this disclosure. The capacitive touch sensor, generally represented by the numeral 1500, comprises a substrate 1502, a first capacitive sensor element 1512, a second capacitive sensor element 1514, a substantially non-deformable spacer 1504, a conductive plane/pedestal 1520 (puck) and a deformable cover 1508. Formation of the deformable space 1516 in the deformable cover 1508 may be by, for example but limited to, etching, stamping, milling, etc. The conductive plane/pedestal 1520 may be attached to an inside face of the deformable cover 1508, inside of the space 1516, and over the first and second capacitive sensor elements 1512 and 1514.

The portion of the deformable cover 1508 having the space 1516 formed therein is flexible so that the conductive plane/pedestal 1520 will move towards the first and second capacitive sensor elements 1512 and 1514 when force 750 is applied to that portion of the deformable cover 1508. The other portion of the deformable cover 1508 over the spacer 1504 is not as flexible as the portion over the space 1516 and will not deform as much, thereby isolating any capacitive change to the first and second capacitive sensor elements 1512 and 1514 under just the portion of the deformable cover 1508 having the force 750 applied thereto.

The first capacitive sensor element 1512 may be coupled to an input of the AFE 404 and the second capacitive sensor element 1514 may be coupled to a supply common or ground. If the conductive plane/pedestal 1520 is not connected to anything, it acts as a coupling plate between the first and second capacitive sensor elements 1512 and 1514. However, If the conductive plane/pedestal 1520 is connected to a supply common or ground 1534, then the first and second capacitive sensor elements 1512 and 1514 may be independently connected to the AFE 404 and a slider arrangement and operation is possible as shown in FIG. 10 and described more fully hereinabove.

The deformable cover 1508 may be used as an environmental seal for improved physical and weather protection. The deformable cover 1508 may be light transmissive, and may have selectable areas thereof illuminated based upon actuation of the first and second capacitive sensor elements 1512 and 1514 in those areas. The substrate 1502 may also be light transmissive. Materials for the deformable cover 1508, conductive plane/pedestal 1520, capacitive sensor elements 1512 and 1514, and substrate 1502 may be as described more fully hereinabove. A light source (not shown) may be placed in the space 1516 and light will be dispersed therein so as to light up the portion of the deformable cover 1508 over the space 1516.

Figure 16:
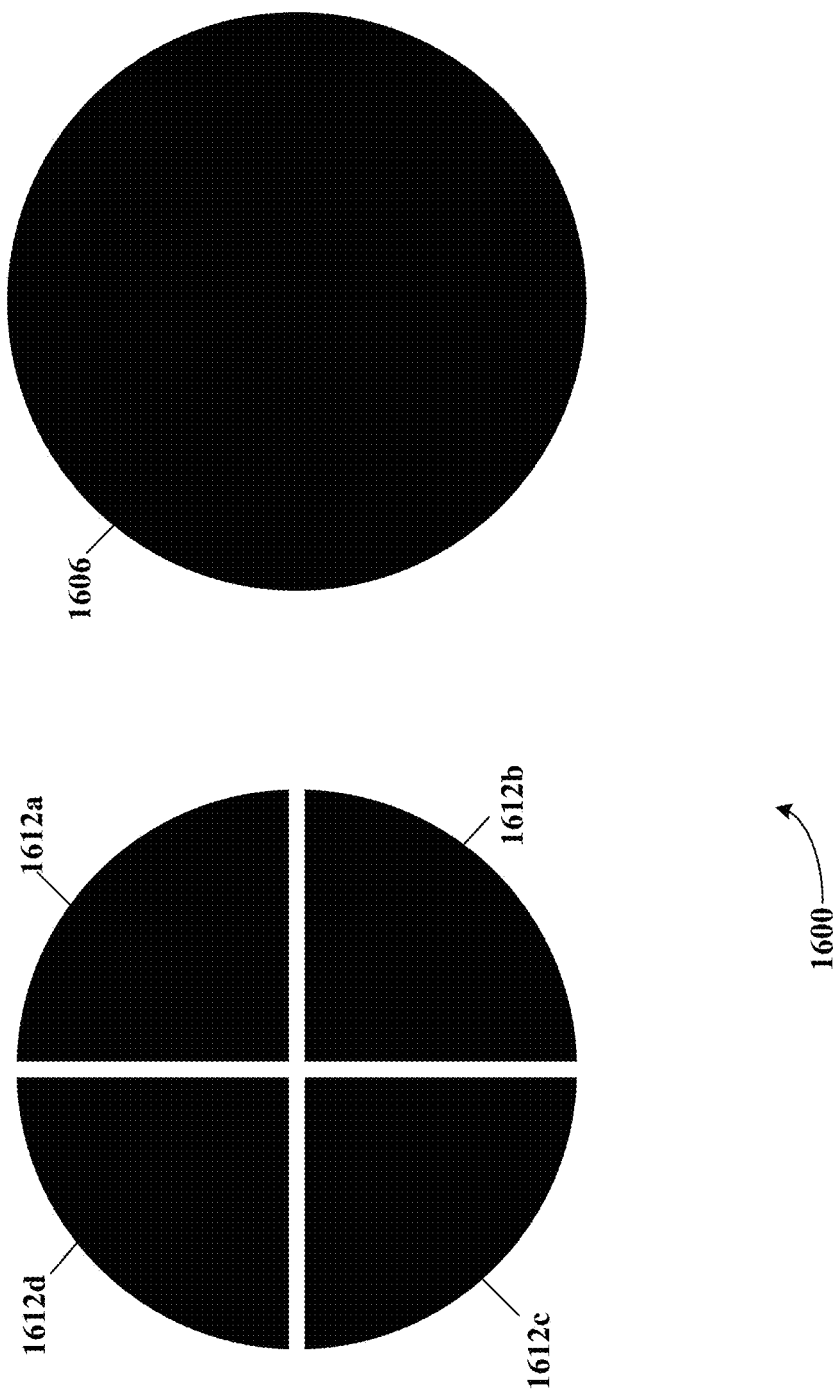
FIG. 16 illustrates a schematic plan view of a capacitive touch slider, according to yet another specific example embodiment of this disclosure.

Referring to FIG. 16, depicted is a schematic plan view of a capacitive touch slider, according to yet another specific example embodiment of this disclosure. The capacitive touch slider, generally represented by the numeral 1600, comprises substantially the same elements as the capacitive touch sensor 1500 shown in FIGS. 14 and 15 above, with the addition of at least three capacitive sensor elements 1612 (four sensor elements shown in FIG. 16). The conductive plane/pedestal 1520 (puck) may be over and proximate to the at least three capacitive sensor elements 1612. The conductive plane/pedestal 1520 (puck) may also be replaced by a conductive deformable plane 1606 and a plurality of mini-pedestals (1030) such as depicted in FIG. 10. The capacitive touch slider 1600 may be used as, for example but is not limited to, a joystick 1748 (see FIG. 17), a computer touch pad or mouse, etc. It is contemplated and within the scope of this disclosure that the capacitive sensor elements 1612, and the conductive plane/pedestal 1520 (puck) or conductive deformable plane 1606 may by fabricated into any shape(s).

Figure 17:
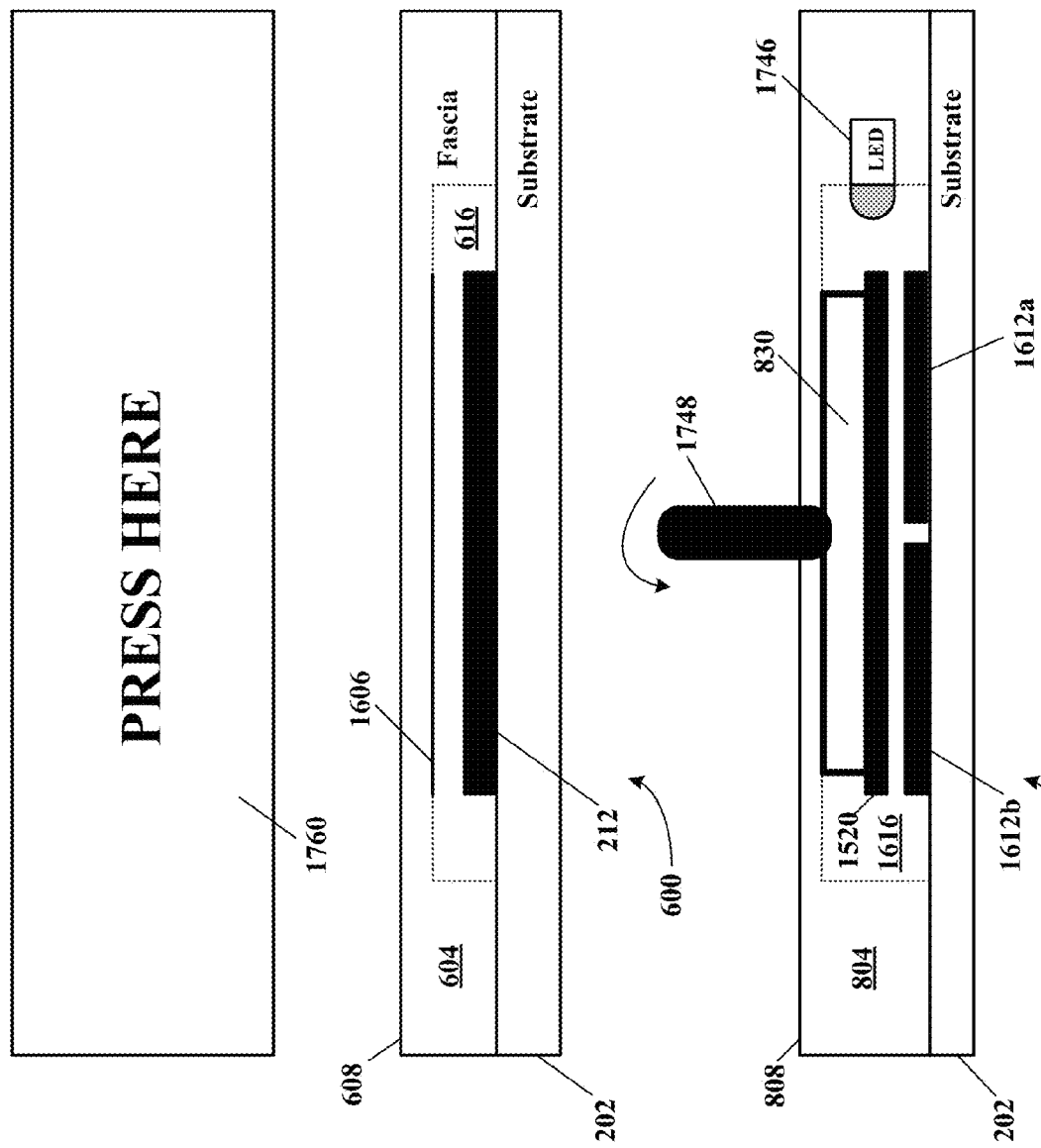
FIG. 17 illustrates schematic elevational and plan views of various additional features that may be provided with the capacitive touch key, slider and/or pad, according to the specific example embodiments of this disclosure.

Referring to FIG. 17, depicted are schematic elevational and plan views of various additional features that may be provided with the capacitive touch key, slider and/or pad, according to the specific example embodiments of this disclosure. Any or all of the aforementioned embodiments may be provided with any one or more of the following additional features. A "joy stick" 1748 may be attached to a pedestal 830 which may be attached to a metal target 1620. When the joy stick 1748 is moved, the pedestal 830 and target 1620 will move proportionally. Movement of the target 1620 will change the capacitance values of the capacitance sensors 1612$a$ and 1612$b$ (more than two sensors 1612 may be utilized). A light source, e.g., light emitting diode 1746, electroluminescent layer, organic light emitting diode (OLED) layer, electrophoretic layer, etc. Alpha-numeric labels 1760 may be provided on the fascia 608 to identify the function of the capacitive touch key.

An OLED (organic light-emitting diode) is a light-emitting diode (LED) in which the emissive electroluminescent layer is a film of organic compounds which emit light in response to an electric current. This layer of organic semiconductor material is situated between two electrodes. Generally, at least one of these electrodes is transparent. Electroluminescence (EL) is an optical phenomenon and electrical phenomenon in which a material emits light in response to the passage of an electric current or to a strong electric field.

A feature of the present invention may be a metal target (820) attached to a pedestal (830). Another feature may be a light source, e.g., light emitting diode (LED) 1746, for back lighting (face) fascia legends. Another feature is a film layer for the fascia and the conductive deformable plane comprising a visually clear, conductive layer of Indium Tin Oxide (ITO), Antimony Tin Oxide (ATO) or Graphene deposited onto a face of the fascia proximate to the capacitive sensor by sputtering, silk screening, etc. Another feature is silk screening a visually opaque, electrically conductive layer of silver ink for the conductive deformable plane that is printed to leave openings for back lighting therethrough.

Another feature is providing a light source layer between the capacitive sensor element and the conductive deformable plane. Another feature is providing an electroluminescent layer for back lighting the capacitive touch key and located between the target and fascia. Another feature is providing an organic light emitting diode (OLED) layer for back lighting the capacitive touch key and located between the target and fascia. Another feature is providing an electrophoretic layer for back lighting the capacitive touch key and located between the target and fascia.

Another feature is providing micro-perforated target and/or fascia layer for allowing light to pass therethrough. Another feature is providing a lighting layer behind the capacitive sensor element and providing light through openings in the capacitive sensor element. Another feature is providing a lighting layer behind the substrate and providing light through openings in the substrate and capacitive sensor element.

Another feature is a button system comprising a conductive target layer bonded to a spacer layer and having an opening over a capacitive sensor element. Another feature is marking a target layer to show a location and function of the capacitive touch key associated therewith. Another feature is adding a plastic layer over the target layer to form a fascia with markings to show the location and function of the capacitive touch key associated therewith.

Another feature is providing two touch key buttons shaped like overlapping triangles to form a slider function. Another feature is providing a plurality of capacitive sensor elements formed into a circular slider. Another feature is providing a plurality of capacitive sensor elements formed into an X-Y matrix for use as a positional input system. Another feature is providing a target layer comprising a continuous conductive sheet, capacitively coupled to a ground plane surrounding the capacitive sensor elements. Another feature is providing a target layer comprising a continuous conductive sheet, capacitively coupled to a ground plane for improved noise immunity. Another feature is providing a target isolation layer, one above each capacitive sensor element, with each sensor element divided in half whereby a first half is coupled to a power supply common or ground and the second half acts as the capacitive sensor element.

Another feature is providing the spacer layer as a double sided adhesive sheet. Another feature is providing the spacer layer as an additional layer in a multilayer printed circuit board. Another feature is providing a spacer layer implemented as an etched pocket in an underside of a target layer. Another feature is providing a spacer layer implemented as a machined pocket in a plastic fascia and a target layer implemented as a conductive plated pedestal. Another feature is providing a target implemented as a metal disc fastened to a pedestal. Another feature is providing a target implemented as a metal snap dome, actuated by a pedestal.

Another feature is providing two capacitive sensor elements, one at each end of a vertical rib. As the rib is pressed by a user's finger, the force on the two sensors is divided proportionally to the position of the user's finger, thereby creating a slider function with only two capacitive sensor elements.

Another feature is providing at least three capacitive sensor elements mounted around a circumference of a cylinder with a flexible cylinder target surrounding the at least three capacitive sensor elements. When a user squeezes the outer cylinder with his hand and then rotates the hand around the outer cylinder, the at least three capacitive sensor elements will detect the moving deflection of the cylinder target as the fingers of the hand rotate therearound. A further feature is using the outer cylinder for back/right/left detection to create a three axis detector. Still a further feature is moving the outer cylinder up/down to create a four axis detector.

Another feature is detecting capacitance value change of the capacitive sensor element(s) with a charge time measurement unit (CTMU). Another feature is detecting capacitance value change of the capacitive sensor element(s) with a capacitive sensing module (CSM). Another feature is detecting capacitance value change of the capacitive sensor element(s) with a capacitive voltage divider (CVD). Another feature is detecting capacitance value change of the capacitive sensor element(s) with a charge balancing detector. Another feature is detecting capacitance value change of the capacitive sensor element(s) with a mutual capacitance detector.

Another feature is coupling a target layer to a capacitive touch input and a digital output driver for providing a grounded target layer or use as a proximity detector, wherein when the digital output driver is at a logic low the target layer is at a power supply common or ground and when at a high impedance (off) the target layer may be used to detect the presence of an object (e.g., finger).

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A physical force capacitive touch sensor, comprising:
    a substrate;
    a capacitive sensor element on a face of the substrate comprising an array of electrodes;
    a cover comprising a first section forming a substantially non-deformable spacer on the substrate that surrounds the capacitive sensor element and a second section forming a flexible cover covering the capacitive sensor element;
    an electrically conductive plane coupled with the flexible cover via an array of pedestals and being proximate to the capacitive sensor element and being arranged to at least partially cover each electrode in said array of electrodes;
    wherein a density of pedestals in the array of pedestals coupled between the flexible cover and the electrically conductive plane is greater than a density of electrodes in the array of electrodes; and wherein when a mechanical force is applied to the flexible cover, the flexible cover and electrically conductive plane are biased toward the capacitive sensor element, whereby the capacitive sensor element changes capacitance value.

2. The physical force capacitive touch sensor according to claim 1, wherein the cover is a single piece cover and the electrically conductive plane is a part of the single piece cover.

3. The physical force capacitive touch sensor according to claim 1, wherein a deformable space around the capacitive sensor element is created by the flexible cover and the substantially non-deformable spacer, wherein the flexible cover is light transmissive.

4. The physical force capacitive touch sensor according to claim 1, wherein the substantially non-deformable spacer is light inhibitive.

5. The physical force capacitive touch sensor according to claim 1, further comprising an alpha-numeric emblem on the flexible cover to indicate a function of an associated capacitive sensor element.

6. The physical force capacitive touch sensor according to claim 5, wherein the alpha-numeric emblem is silk screened onto the flexible cover or the alpha-numeric emblem is embossed into the flexible cover or the alpha-numeric emblem is stamped onto the flexible cover.

7. The physical force capacitive touch sensor according to claim 1, wherein the electrically conductive plane is a layer of Indium Tin Oxide (ITO) disposed on a face of the flexible cover or a layer of Antimony Tin Oxide (ATO) disposed on a face of the flexible cover or a layer of Graphene disposed on a face of the flexible cover.

8. The physical force capacitive touch sensor according to claim 1, further comprising a light source, wherein the light source is an electroluminescent (EL) layer or an organic light emitting diode (OLED) layer or an electrophoretic coating of light emitting material.

9. The physical force capacitive touch sensor according to claim 1, wherein the other electrode of the capacitive sensor element is coupled to an input of a capacitance value measurement circuit.

10. The physical force capacitive touch sensor according to claim 1, wherein the substrate and the capacitive sensor element are fabricated from a printed circuit board.

11. The physical force capacitive touch sensor according to claim 1, wherein the light transmissive substrate comprises glass or plastic.

12. The physical force capacitive touch sensor according to claim 1, wherein the pedestals are round, square, or rectangular.

13. The physical force capacitive touch sensor according to claim 1, wherein the plurality of capacitive sensor elements are arranged to form a ring and the electrically conductive plane is ring-shaped.

14. The physical force capacitive touch sensor according to claim 1, further comprising a light source for illuminating a face of the flexible cover.

15. The physical force capacitive touch sensor according to claim 14, wherein the light source is located between the electrically conductive plane and the flexible cover or between the electrically conductive plane and the capacitive sensor element or between the capacitive sensor element and the substrate or on an opposite face of the substrate from which the capacitive sensor element is located, whereby light shines through the substrate to illuminate the flexible cover.

16. The physical force capacitive touch sensor according to claim 1, wherein one of the first and second electrodes is coupled with a supply common or ground and the electrically conductive plane is electrically floating.

17. The physical force capacitive touch sensor according to claim 1, wherein the first and second electrodes are configured to be selectively coupled with a capacitance measurement device and the electrically conductive plane is coupled with a supply common or ground.

18. The physical force capacitive touch sensor according to claim 1, further comprising a switch coupled with the electrically conductive plane, wherein in a first operating mode the switch couples the electrically conductive plane and a power supply common or ground, and in a second operating mode, the switch couples the electrically conductive plane with the capacitance value measurement circuit.

19. A capacitive touch sensor arrangement, comprising:
a substrate;
an array of capacitive sensor electrodes linearly or circularly arranged on a face of the substrate or arranged in a matrix on a face of the substrate;
a cover comprising a first section forming a substantially non-deformable spacer on the substrate that surrounds the array of capacitive sensor electrodes and a second section forming a flexible cover covering the array of capacitive sensor elements; and
a continuous electrically conductive deformable plane coupled with the flexible cover and being proximate to the array of capacitive sensor electrodes and being arranged to at least partially cover each capacitive sensor electrode in said array of capacitor sensor electrodes;
an array of mini-pedestals located between the flexible cover and the electrically conductive deformable plane;
wherein a density of mini-pedestals in the array of mini-pedestals between the flexible cover and the electrically conductive deformable plane is greater than a density of capacitive sensor electrodes in the array of capacitive sensor electrodes; and
wherein when a mechanical force is applied to a region of the electrically conductive plane, the electrically conductive plane is biased toward at least one of the capacitive sensor elements physically aligned with the region of the continuous electrically conductive plane, whereby the at least one of the capacitive sensor elements changes capacitance value.

20. The capacitive touch sensor arrangement according to claim 19, further comprising a light source for illuminating a face of the flexible cover, wherein the flexible cover and the electrically conductive deformable plane are light transmissive, wherein when the mechanical force is applied to the flexible cover the electrically conductive deformable plane is biased toward at least one of the plurality of capacitive sensor elements.

21. The capacitive touch sensor arrangement according to claim 19, wherein the mini-pedestals are round, square, or rectangular.

22. The capacitive touch sensor arrangement according to claim 19, further comprising a light source for illuminating a face of the electrically conductive deformable plane.

23. The capacitive touch sensor arrangement according to claim 19, further comprising a capacitive measurement circuit having a plurality of inputs coupled to respective ones of the plurality of capacitive sensor electrodes, and a digital processor coupled to the capacitive measurement circuit and providing force positional information based upon determination of capacitance values of certain ones of the plurality of capacitive sensor electrodes, wherein the digital processor and the capacitive measurement circuit are part of a microcontroller.

24. A physical force capacitive touch key, comprising:
a substrate;
an array of capacitive sensor elements including first and second capacitive sensor elements on a face of the substrate such that a gap is formed between the first and second capacitive sensor elements;
a cover comprising a first section forming a substantially non-deformable spacer on the substrate that forms a cavity including at least the first and second capacitive sensor elements and a second section forming a flexible cover covering at least the first and second capacitive sensor elements; and
a continuous flexibly-deformable electrically conductive plane coupled with the flexible cover via an array of pedestals and being arranged to at least partially cover each capacitor sensor element in the array of capacitive sensor elements including the first and second capacitive sensor elements;
wherein a density of pedestals in the array of pedestals coupled between the flexible cover and the electrically conductive plane is greater than a density of capacitive sensor elements in the array of capacitive sensor elements; and
wherein when a mechanical force is applied to a first region of the continuous flexibly-deformable electrically conductive plane, the electrically conductive plane is biased toward the first capacitive sensor element, whereby the first capacitive sensor element changes capacitance value; and
wherein when the mechanical force is applied to a second region of the continuous flexibly-deformable electrically conductive plane, the electrically conductive plane is biased toward the second capacitive sensor element, whereby the second capacitive sensor element changes capacitance value.

25. The physical force capacitive touch key according to claim 24, further comprising a flexible cover over the continuous flexibly-deformable electrically conductive plane, wherein the flexible cover is light transmissive, wherein when the mechanical force is applied to the flexible cover the electrically conductive plane is biased toward at least one of the first or second capacitive sensor elements.

26. The physical force capacitive touch key according to claim 25, wherein a deformable space around the first and second capacitive sensor elements is created by the flexible cover and the substantially non-deformable spacer.

27. The physical force capacitive touch key according to claim 25, further comprising a light source for illuminating a face of the flexible cover.

28. The physical force capacitive touch key according to claim 24, further comprising:
a capacitive measurement circuit having a plurality of inputs coupled to the first and the second capacitive sensor elements; and
a digital processor coupled to the capacitive measurement circuit and providing force positional information based upon determination of capacitance values of the first and second capacitive sensor elements, wherein the digital processor and the capacitive measurement circuit are part of a microcontroller.

29. A physical force capacitive touch joystick, comprising:
a substrate;
an array of at least three capacitive sensor elements on a face of the substrate; a cover comprising a first section forming a substantially non-deformable spacer on the substrate that forms a cavity including array of the least three capacitive sensor elements and a second section forming a flexible cover covering the array of at least three capacitive sensor elements;
an array of pedestal structures spaced apart from each other and coupled with the flexible cover; and
a continuous electrically conductive plane attached to the array of spaced-apart pedestal structures and proximate to the array of at least three capacitive sensor elements and being arranged to at least partially cover each capacitive sensor element in said array of at least three capacitor sensor elements;
wherein a density of pedestal structures in the array of pedestal structures between the flexible cover and the continuous electrically conductive plane is greater than a density of capacitive sensor elements in the array of capacitive sensor elements; and
wherein when a mechanical force is applied to the continuous electrically conductive plane, the continuous electrically conductive plane is biased toward a subset of one or more of the array of at least three capacitive sensor elements based on a location of the mechanical force applied to the continuous electrically conductive plane, whereby the subset of the array of at least three capacitive sensor elements changes capacitance value.

30. The physical force capacitive touch joystick according to claim 29, further comprising a joy stick attached to at least one of the pedestal structures, wherein when a mechanical motion is applied to the joy stick the mechanical force is applied to the electrically conductive plane.

31. A capacitive touch cylindrical sensor, comprising:
a substrate formed into a cylinder;
a plurality of capacitive sensor elements arranged in a circular arrangement on a substrate;
a cover comprising a first section forming a substantially non-deformable spacer on the substrate that forms a cavity including the plurality of capacitive sensor elements and a second section forming a flexible cover covering the plurality of capacitive sensor elements; and
a continuous electrically conductive deformable structure coupled with the flexible cover via an array of pedestals and having a circular shape and arranged proximate to the plurality of capacitive sensor elements and being arranged to at least partially cover each capacitive sensor element in said plurality of capacitor sensor elements;
wherein a density of pedestals in the array of pedestals coupled between the flexible cover and the continuous electrically conductive plane is greater than a density of the plurality of capacitive sensor elements; and
wherein when a mechanical force is applied to a portion of the continuous electrically conductive deformable structure having the circular shape, the continuous electrically conductive deformable structure is biased toward at least one of the plurality of capacitive sensor elements, whereby the at least one of the plurality of capacitive sensor elements changes capacitance value.

32. The capacitive touch slider according to claim 31, further comprising a flexible cover over the electrically conductive deformable structure, wherein when the mechanical force is applied to the flexible cover the electrically conductive deformable structure is biased toward the at least one of the plurality of capacitive sensor elements.

* * * * *